US006983414B1

(12) United States Patent
Duschatko et al.

(10) Patent No.: US 6,983,414 B1
(45) Date of Patent: Jan. 3, 2006

(54) ERROR INSERTION CIRCUIT FOR SONET FORWARD ERROR CORRECTION

(75) Inventors: Douglas E. Duschatko, McKinney, TX (US); Andrew J. Thurston, Allen, TX (US)

(73) Assignee: Cisco Technology, Inc., San Jose, CA (US)

( * ) Notice: Subject to any disclaimer, the term of this patent is extended or adjusted under 35 U.S.C. 154(b) by 1004 days.

(21) Appl. No.: 09/821,948

(22) Filed: Mar. 30, 2001

(51) Int. Cl.
*H03M 13/00* (2006.01)

(52) U.S. Cl. .................. 714/782; 714/776
(58) Field of Classification Search ........... 714/782, 714/784, 712, 776, 703; 370/244; 713/400
See application file for complete search history.

(56) References Cited

U.S. PATENT DOCUMENTS

| 4,597,083 | A | | 6/1986 | Stenerson ............... 371/37 |
| 4,873,688 | A | | 10/1989 | Maki et al. ............. 371/37.1 |
| 5,051,999 | A | | 9/1991 | Erhart et al. ............. 371/41 |
| 5,363,379 | A | * | 11/1994 | Eckenrode et al. ........ 714/703 |
| 5,574,717 | A | * | 11/1996 | Tomizawa et al. ......... 370/244 |
| 5,583,499 | A | | 12/1996 | Oh et al. ................. 341/94 |
| 5,642,367 | A | | 6/1997 | Kao ..................... 714/784 |
| 5,673,279 | A | | 9/1997 | Oskouy et al. ........... 714/819 |
| 5,710,782 | A | | 1/1998 | Weng ................... 714/785 |
| 5,818,855 | A | | 10/1998 | Foxcroft ................ 714/759 |
| 6,199,188 | B1 | | 3/2001 | Shen et al. ............. 714/782 |
| 6,286,123 | B1 | | 9/2001 | Kim .................... 714/781 |
| 6,385,751 | B1 | | 5/2002 | Wolf .................... 714/784 |
| 6,571,368 | B1 | | 5/2003 | Chen ................... 714/784 |
| 6,683,855 | B1 | * | 1/2004 | Bordogna et al. ......... 370/244 |
| 6,684,350 | B1 | * | 1/2004 | Theodoras et al. ........ 714/712 |
| 6,684,364 | B2 | | 1/2004 | Cameron ............... 714/785 |
| 6,751,743 | B1 | * | 6/2004 | Theodoras et al. ........ 713/400 |
| 2002/0165962 | A1 | | 11/2002 | Alvarez et al. ........... 709/226 |

OTHER PUBLICATIONS

Christian Schuler, "Code Generation Tools For Hardware Implementation Of FEC Circuits," GMD FOKUS, Kaiserin–Augusta–Allee 31, 10589 Berlin, Germany.
Shu Lin and Daniel J. Costello, Jr., "Error Control Coding Fundamentals and Applications," Prentice–Hall, Inc. Englewood Cliffs, New Jersey, Chapter 6, pp. 141–183.

* cited by examiner

*Primary Examiner*—David Ton
(74) *Attorney, Agent, or Firm*—Campbell Stephenson Ascolese LLP

(57) ABSTRACT

An OC-192 front-end application-specific integrated circuit (ASIC) de-interleaves an OC-192 signal to create four OC-48 signals, and decodes error-correction codes embedded in each of the four OC-48 signals. An error insertion circuit is also provided for verifying correct operation of encoding and decoding circuits. A desired number of errors may be programmed for insertion into the OC-48 data signals. Error insertion may be performed in an iterative fashion to insert into different data signals the desired number of errors, wherein the errors are placed within the code words of the data signals at different location permutations for each data signal. In one implementation, error verification is performed using an error accumulator located in the receiver, and means are provided for examining an error accumulator count of the error accumulator to see if the number of accumulated errors matches with the number of inserted errors.

39 Claims, 10 Drawing Sheets

ERROR INSERTION CIRCUIT FOR SONET FORWARD ERROR CORRECTION

CROSS REFERENCE TO RELATED APPLICATIONS

The present invention is related to subject matter disclosed in the following co-pending applications, which are all hereby incorporated by reference herein in their entireties:

1. United States patent application entitled, "Automatic Generation of Hardware Description Language Code for Complex Polynomial Functions", Ser. No. 09/822,713, naming Andrew J. Thurston and Douglas Duschatko as inventors and filed Mar. 30, 2001;

2. United States patent application entitled, "BCH Forward Error Correction Decoder", Ser. No. 09/822,950, naming Andrew J. Thurston as inventor and filed Mar. 30, 2001; and 3. United States patent application entitled, "Galois Field Multiply Accumulator", Ser. No. 09/822,733, naming Andrew J. Thurston as inventor and filed Mar. 30, 2001.

BACKGROUND OF THE INVENTION

1. Field of the Invention

The present invention generally relates to data transmission systems, such as those used in computer and telecommunications networks, and particularly to fiber optic transmission systems for high-speed digital traffic, such as synchronous optical network (SONET) systems. More specifically, the present invention is directed to an improved method and apparatus for providing error correction in a SONET transmission system.

2. Description of the Related Art

As information technology progresses, increasingly difficult demands are being placed on data transmission systems that support the transfer of information between computing devices. A variety of computer and telecommunications networks have been devised to handle the growing traffic in data, voice and video signals. Typical network designs include local area networks (LANs), ring-connected networks such as token ring, integrated services digital networks (ISDNs), and wide area networks (WANs) such as system network architecture (SNA) networks, or packet (X.25) networks (including the Internet). Various protocols are used to manage the transmission of information between clients and servers (or peers) in these networks, using intelligent agents located at network nodes, routers and bridges.

One of the key requirements of a high-speed digital network is to reduce the end-to-end delay in order to satisfy real-time delivery constraints, and to achieve the necessary high nodal throughput for the transport of voice and video. Given the growing number of network interconnections, more advanced distributed processing capabilities between workstations and supercomputers, and the pervasive use of the Internet, the current data transmission profile requires ever more bandwidth and connectivity. Although copper wires have been the preferred transmission media for decades, the physical limitations imposed by copper lines have forced the communications industry to rely more heavily on fiber-optic transmission systems. One such system is commonly referred to as a synchronous optical network (SONET).

SONET is an intelligent system that provides advanced network management with a standard optical interface. The American National Standards Institute (ANSI) coordinates and approves SONET standards. An international version of SONET known as synchronous digital hierarchy (SDH) is published by the International Telecommunications Union (ITU). In a WAN or over the Internet, data traffic is often carried over SONET lines, sometimes using asynchronous transfer mode (ATM) technology as a management layer. SONET uses octet multiplexing to create a higher-speed data stream from lower-speed tributary signals. A signal hierarchy referred to as synchronous transport signals (STS) is used to aggregate lower speed lines. For example, the synchronous transport signal level 1 (STS-1) electrical circuits are used to support the corresponding SONET optical carrier 1 (OC-1) optical signals with a basic speed of 51.84 Mbits/s. Higher STS levels (STS-n) provide speeds that are multiples of STS-1, and are created by interleaving STS-1 signals, octet-by-octet. Synchronous transport signals are divided into a fixed number of frames of 125 $\mu$s duration.

SONET uses a self-healing ring architecture that allows traffic to be rerouted if one communications path is disabled. A typical SONET ring comprises a plurality of hubs or nodes, each coupled to another by at least one optical fiber link. At each node, a gateway converts an incoming electrical signal that may be associated with a telephone call into a block of optical information. The gateway places the block of optical information onto the ring within a particular time slot of an interchange frame having a particular synchronization (speed). Each time slot in each frame corresponds to a particular destination (i.e., node) within the ring. Thus, the gateway at each node converts the block of information appearing within the time slot associated with that node into corresponding electrical signals. In this way, traffic on the ring is routed in automatically. Connecting a large number of nodes (i.e., gateways) in a single ring is often impractical, so some nodes may be organized into smaller (subsidiary) rings that are connected to each other by a backbone ring to minimize the length of the fiber links. SONET backbones are widely used to aggregate T1 and T3 lines (lines that use T-carrier multiplexing).

SONET offers bandwidth up to OC-192 (9.953 Gbits/s) and can carry a wide variety of information. SONET also offers exceptional BERs (bit-error rates) of, e.g., 1 error in 10 billion bits, compared with copper transmission methods of 1 error in 1 million bits. Error detection and correction is an essential aspect of any SONET system. Data may be corrupted during transmission due to many different reasons, such as a soft error (a random, transient condition caused by, e.g., stray radiation, electrostatic discharge, or excessive noise), or a hard error (a permanent condition, e.g., a defective circuit or memory cell). One common cause of errors is a soft error resulting from alpha radiation emitted by the lead in the solder (C4) bumps used to form wire bonds with circuit leads. Most errors are single-bit errors, that is, only one bit in the field is incorrect.

Two primary error control strategies have been popular in practice. They are the FEC (Forward Error Correction) strategy, which uses error correction alone, and the ARQ (Automatic Repeat Request) strategy which uses error detection combined with retransmission of corrupted data. The ARQ strategy is generally preferred for several reasons. The main reason is that the number of overhead bits needed to implement an error detection scheme is much less then the number of bits needed to correct the same error. ARQ algorithms include cyclical redundancy check (CRC) codes, serial parity, block parity, and modulo checksum. Parity checks, in their most simple form, constitute an extra bit that is appended to a binary value when it is to be transmitted to another component. The extra bit represents the binary modulus (i.e., 0 or 1) of the sum of all bits in the binary value. In this manner, if one bit in the value has been corrupted, the binary modulus of the sum will not match the setting of the parity bit. If, however, two bits have been corrupted, then the parity bit will match, falsely indicating a correct parity. In other words, a simple parity check will detect only an odd number of incorrect bits (including the parity bit itself).

The FEC strategy is mainly used in links where retransmission is impossible or impractical, and is usually implemented in the physical layer, transparent to upper layers of the transmission protocol. When the FEC strategy is used, the transmitter sends redundant information along with the original bits, and the receiver decodes the bits to identify and correct errors. The number of redundant bits in FEC is much larger than in ARQ. However, several factors have provided the impetus for reconsideration of the traditional preference for retransmission schemes over forward error correction techniques. Those factors include the increased speed and decreased price of processors, and the emergence of certain applications for which retransmission for error recovery is undesirable or impractical. For example, some video applications by their very nature exclude the possibility of using data retransmission schemes for error recovery. Another application in which data retransmission schemes appear ill-suited for implementation is wireless data communications systems. Those systems are known for their high number of retransmissions necessitated by various sources of random noise and deterministic interference that give rise to corrupted receptions. The significant number of retransmissions on those wireless channels may be cost-prohibitive when one considers the relatively high cost of bandwidth for wireless data connections.

Algorithms used for FEC include convolutional codes, Hamming codes, Reed-Solomon codes, and BCH (Bose-Chaudhuri-Hocquenghem) codes. BCH codes form a large class of powerful random error-correcting cyclic codes, and have the advantage of being robust and very efficient in terms of the relatively low number of check bits required. These check bits are also easily accommodated in the unused SONET overhead byte locations. BCH codes are specified with three primary parameters, n, k, and t, where:

n=block length (the length of the message bits plus the additional check bits)

k=message length (the number of data bits included in a check block)

t=correctable errors (the number of errors per block which the code can correct).

BCH codes have the property that the block length n is equal to $2^m-1$, where m is a positive integer. The code parameters are denoted as (n,k). Another parameter often referred to is the "minimum distance" $d_{min} \geq 2t+1$. The minimum distance defines the minimum number of bit positions by which any two code words can differ. A hybrid FEC/ARQ technique which utilizes BCH coding is disclosed in U.S. Pat. No. 5,844,918. The ITU committee responsible for error correction in SONET networks (committee T1X1.5) has developed a standard for FEC in SONET OC-192 systems which implements a triple-error correcting BCH code referred to as BCH-3.

Galois field mathematics is the foundation for BCH-based forward error correction. A Galois field is a type of field extension obtained from considering the coefficients and roots of a given polynomial (also known as root field). The generator polynomial for a t-error correcting BCH code is specified in terms of its roots from the Galois field $GF(2^m)$. If $\alpha$ represents the primitive element in $GF(2^m)$, then the generator polynomial g(X) for a t-error correcting BCH code of length $2^m-1$ is the lowest-degree polynomial which has $\alpha$, $\alpha^2, \alpha^3, \ldots, \alpha^{2t}$ as its roots, i.e., $g(\alpha^i)=0$ for $1 \leq i \leq 2t$. It can be shown from the foregoing that g(X) must be the least common multiple (LCM) of $\phi_1(X)$, $\phi_3(X)$, $\ldots$, $\phi_{2t-1}(X)$, where $\phi_i(X)$ is the minimal polynomial of $\alpha^i$. For example, the triple-error correcting BCH code of length 15 is generated by the polynomial $$g(X) = LCM\{\varphi_1(X), \varphi_3(X), \varphi_5(X)\}$$
$$= (1 + X + X^4)(1 + X + X^2 + X^3 + X^4)(1 + X + X^2)$$
$$= 1 + X + X^2 + X^4 + X^5 + X^8 + X^{10}.$$

A more detailed discussion of Galois mathematics as applied to BCH codes may be found in chapter 6 of "Error Control Coding: Fundamentals and Applications," by Shu Lin and Daniel J. Costello, pp. 141–170.

Decoding of BCH codes likewise requires computations using Galois field arithmetic. Galois field arithmetic can be implemented (in either hardware or software) more easily that ordinary arithmetic because there are no carry operations. The first step in decoding a t-error correction BCH code is to compute the 2t syndrome components $S_1$, $S_1, \ldots, S_{2t}$. For a hardware implementation, these syndrome components may be computed with feedback registers that act as a multiply accumulator (MAC). Since the generator polynomial is a product of, at most, t minimal polynomials, it follows that, at most, t feedback shift registers (each consisting of at most m stages) are needed to form the 2t syndrome components, and it takes n clock cycles to complete those computations. It is also necessary to find the error-location polynomial which involves roughly $2t^2$ additions and $2t^2$ multiplications. Finally, it is necessary to correct the error(s) which, in the worst case (for a hardware implementation), requires t multipliers shifted n times. Accordingly, circuits that implement BCH codes are typically either quite complex, or require many operations. For example, the BCH-3 iterative algorithm requires up to five separate steps, with each step involving a varying number of computations, and any hardware implementation of BCH-3 must support the maximum possible number of steps/computations.

In light of the foregoing, it would be desirable to devise an improved hardware implementation for BCH decoding that reduces the number of steps/computations required for the decoding algorithm. In particular, it would be desirable to devise a Galois field multiply accumulator that performs the multiply/accumulate operations faster. It would be further advantageous if the decoder could be provided with a means to verify the correct operation of the FEC circuitry.

SUMMARY OF THE INVENTION

It is therefore one object of the present invention to provide an improved data transmission system having forward error correction (FEC).

It is another object of the present invention to provide such a system which utilizes a fast BCH decoder for FEC.

It is yet another object of the present invention to provide such a system which allows verification of proper operation of the FEC mechanism.

It is still another object of the present invention to provide such a system which may be implemented in an input/output devices adapted for SONET OC-192 transmissions.

The foregoing objects are achieved in an OC-192 input/output card generally comprising four OC-48 processors and an OC-192 front-end application-specific integrated circuit (ASIC) connected to the four OC-48 processors. The OC-192 front-end ASIC has means for de-interleaving an OC-192 signal to create four OC-48 signals, and means for decoding error-correction codes embedded in each of the four OC-48 signals. The decoding means generates a Bose-Chaudhuri-Hocquenghem (BCH) error polynomial associated with a given one of the error-correction codes, in no more than 12 clock cycles. The decoding circuit includes a plurality of Galois field multiply accumulators, and a state machine which controls the Galois field units. In the specific embodiment wherein the error-correction code is a BCH triple error-correcting code, four Galois field units are used to carry out the following six equations:

$$d_0 = S_1, \qquad (1)$$

$$d_1 = S_3 + S_1 S_2, \qquad (2)$$

$$\sigma^1(x) = 1 + S_1 X, \qquad (3)$$

if $(d_1=0)$ then $\sigma^2(x) = \sigma^1(x)$ else if $(d_0=0)$ then $\sigma^2(x) = q_0 \sigma^1(x) + d_1 X^3$ else $\sigma^2(x) = q_0 \sigma^1(x) + d_1 X^2, \qquad (4)$ $$d_2 = S_5 \sigma_0 + S_4 \sigma_1 + S_3 \sigma_2 + S_2 \sigma_3, \text{ and} \qquad (5)$$

if $(d_2=0)$ then $\sigma^3(x) = \sigma^2(x)$ else $\sigma^3(x) = q_1 \sigma^1(x) + d_1 X^3, \qquad (6)$ where $d_i$ are correction factors, $S_i$ are the BCH code syndromes, $\sigma^i$ are minimum-degree polynomials, $\sigma_i$ are the four coefficients for $\sigma^2(x)$, and $q_i$ are additional correction factors—$q_0$ is equal to $d_0$, unless $d_0$ is zero, in which case $q_0$ is 1, and $q_i$ is equal to $d_i$, unless $d_i$ is zero in which case $q_i = q_0$. Once the error polynomial has been generated, a conventional technique (Chien's algorithm) can be used to search for error location numbers.

The Galois field units are advantageously designed to complete a Galois field multiply/accumulate operation in a single clock cycle. The Galois field units may also operate in multiply or addition pass-through modes. A Galois field multiply accumulator has a first multiplexer whose output is coupled to a first input of a Galois field multiplier, a second multiplexer whose output is coupled to a second input of the Galois field multiplier, and a third multiplexer whose output is coupled to a first input of a Galois field adder, wherein an output of the Galois field multiplier is further coupled to a second input of the Galois field adder; the state machine controls respective select lines for each of said multiplexers.

An error insertion circuit is also provided for verifying correct operation of the BCH encoding and decoding circuits. With this circuit, the technician can programmably selecting a desired number of errors for insertion into a plurality of the OC-48 data signals. A plurality of code words are defined, and the desired number of errors are inserted into one of the data signals using the error insertion circuit. The error insertion may be performed in an iterative fashion to insert into different data signals the desired number of errors, wherein the errors are placed within the code words of the data signals at different location permutations for each data signal. The data signals with the inserted errors are transmitted to a receiver, where it is determined whether the data signals received contain the inserted errors. In one implementation, the error verification is performed using an error accumulator located in the receiver, and means are provided for examining an error accumulator count of the error accumulator to see if the number of accumulated errors matches with the number of inserted errors.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
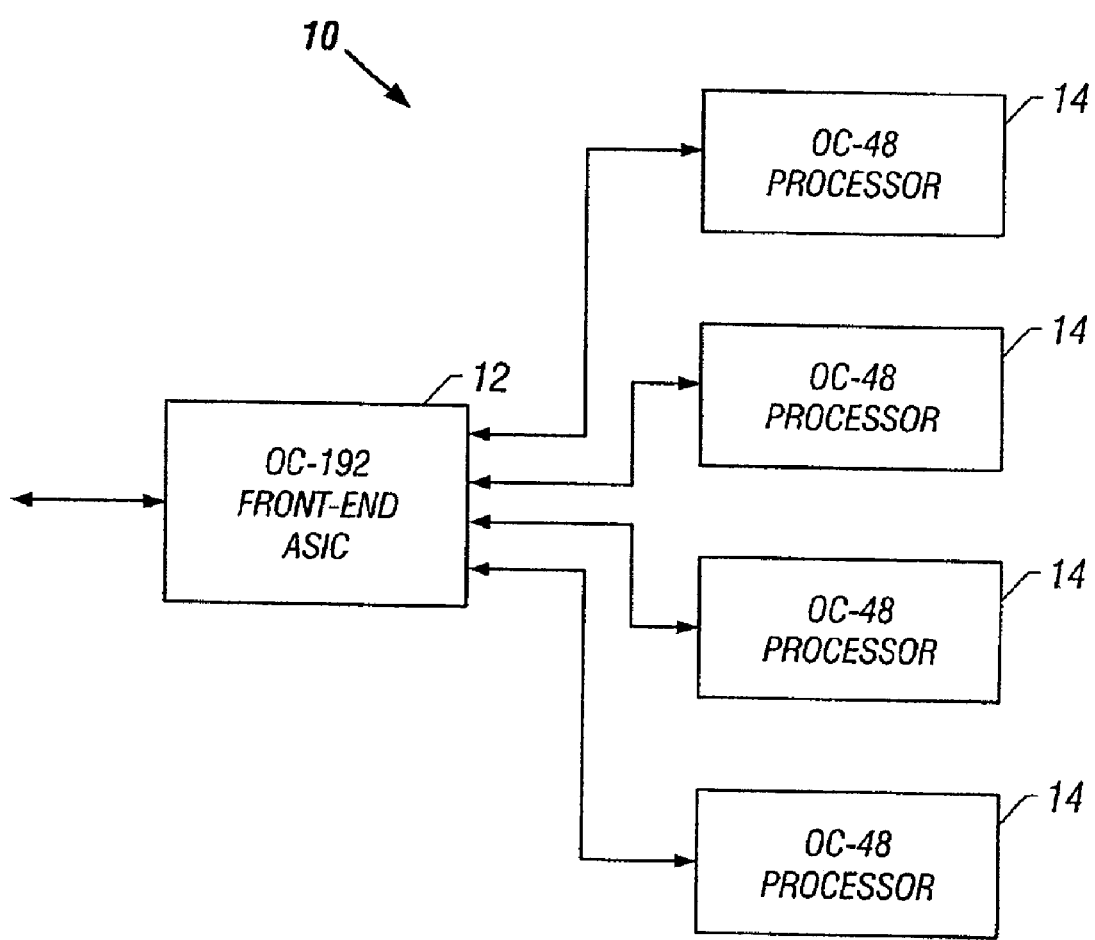
FIG. 1 is a high-level block diagram of one embodiment of a SONET OC-192 input/output (I/O) card according to the present invention.

With reference now to the figures, and in particular with reference to FIG. 1, there is depicted one embodiment 10 of an input/output (I/O) card adapted for use in a SONET OC-192 system, and constructed in accordance with the present invention. I/O card 10 is generally comprised of a front-end OC-192 complementary metal-oxide semiconducting (CMOS) application-specific integrated circuit (ASIC) 12, and four backend OC-48 processors 14. As explained further below, front-end ASIC 12 allows the processing of an arbitrary OC-192 signal from 192 STS-1 s to a signal OC-192c. Chip 12 interleaves and de-interleaves the four OC-48 signals received from and transmitted to the companion OC-48 processors 14. Chip 12 also provides all SONET section and line overhead termination and generation (excluding pointer processing).

Figure 2:
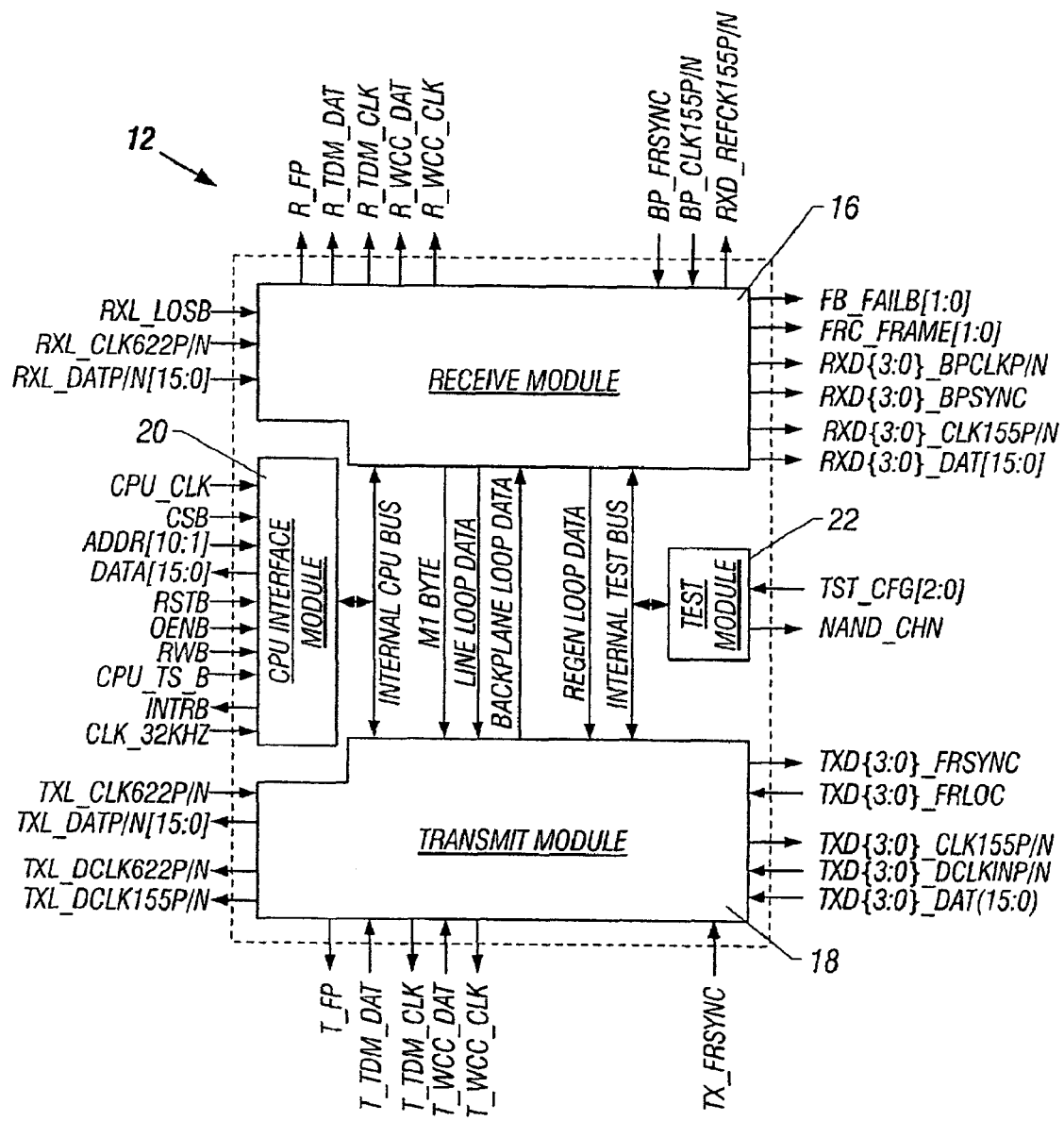
FIG. 2 is a block diagram of one embodiment of an OC-192 front-end application-specific integrated circuit (ASIC) that may be used with the OC-192 I/O card of FIG. 1.

Front-end ASIC 12 is shown in further detail in the block diagram of FIG. 2, and includes a receive module 16, a transmit module 18, a CPU interface module 20, and a test module 22. Receive module 16 processes the incoming OC-192 line rate signal, optionally processes the forward error correction (FEC) information, and de-interleaves the OC-192 signal into four OC-48 line rate signals for delivery to the downstream OC-48 processors 14. Transmit module 18 processes the four incoming OC-48 signals from OC-48 processors 14, optionally inserts FEC information, and interleaves the four OC-48 signals into an OC-192 signal for transmission. A central processing unit (CPU) interface module 20 provides a CPU connection to internal device registers, and test module 22 contains logic used for testability of the device. The CPU interface is preferably generic; a suitable CPU that might be supported is Motorola's 860 CPU.

Figure 3:
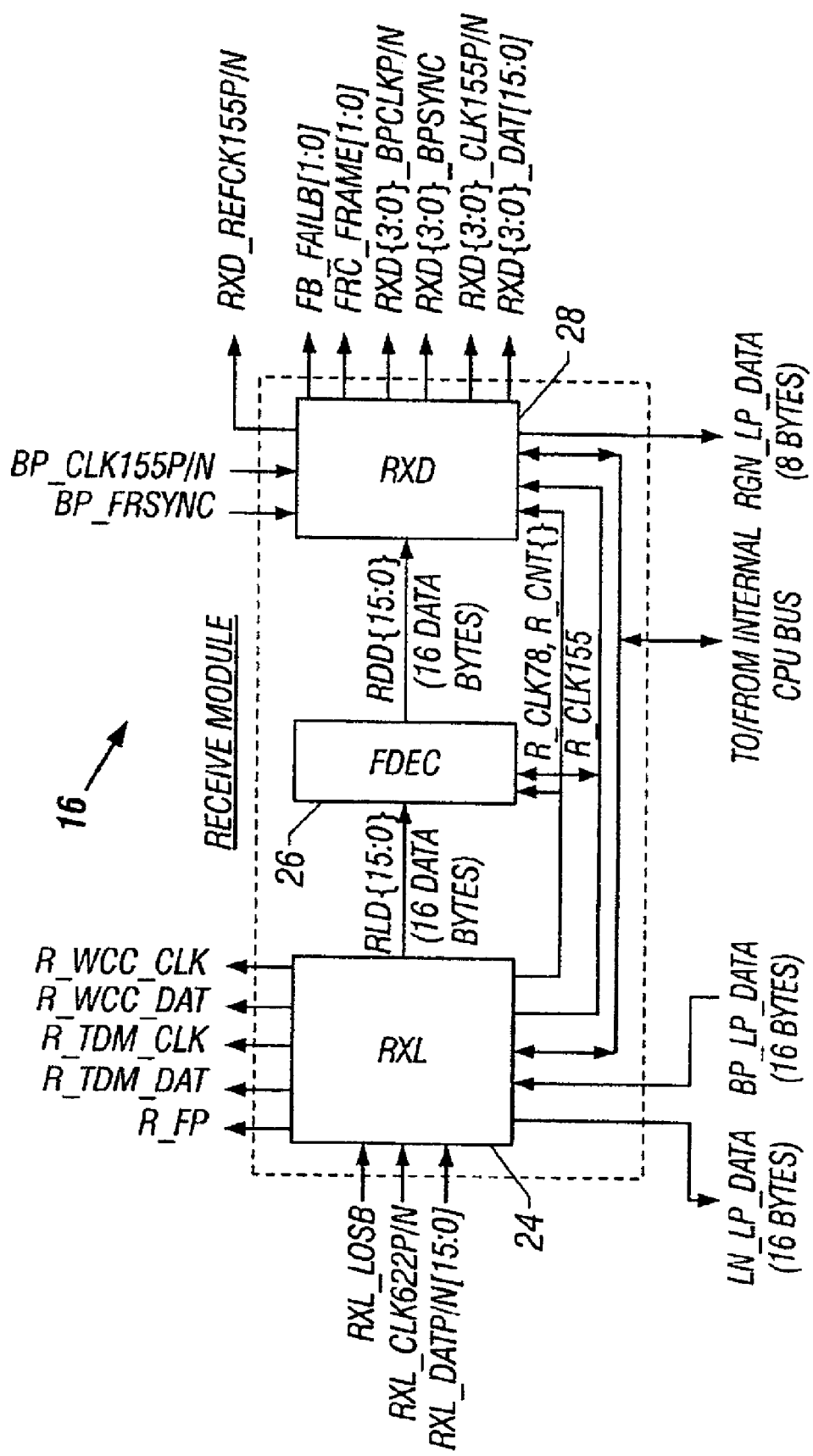
FIG. 3 is a block diagram of a receive module portion of the front-end ASIC of FIG. 2.

Receive module 16 is illustrated in FIG. 3, and includes a receive line section (RXL) 24, an FEC decoder (FDEC) 26, and a receive demultiplexer section (RXD) 28. Data flows through receive module 16 from the left in FIG. 3 (the optical signal input), to the right (de-interleaved output interface). The CPU interface to receive module 16 allows for software access to the configuration and status information associated with the module. Besides the primary chip I/O signals connected to receive module 16, there are also several outputs that are routed to transmit module 18 for error reporting and diagnostic loopback functions.

RXL 24 receives the unaligned OC-192 signal via a 16-bit parallel data bus (at 622 MHz), and demultiplexes it down to 16-bytes wide at 77.76 MHz. The demultiplexed signal is framed by RXL 24 and checked for related framing errors, descrambled, and the SONET section and line overhead bytes are processed. In addition to providing the section and line SONET processing, RXL 24 generates the clocks and frame position counts needed by the rest of the logic in the receive path. The 16-byte primary output data path from RXL 24 is supplied to the input of FEC decoder 26.

FEC decoder 26 de-interleaves the 16-byte data stream into four 4-byte data streams representing the four STS-48 signals. These four streams are fed to the decoder for error correction. After error correction, the four data streams are fed to RXD 28 where the A1/A2 framing bytes are added, and a B1 parity byte is computed and added. The data is then scrambled and passed out of device 12.

Figure 4:
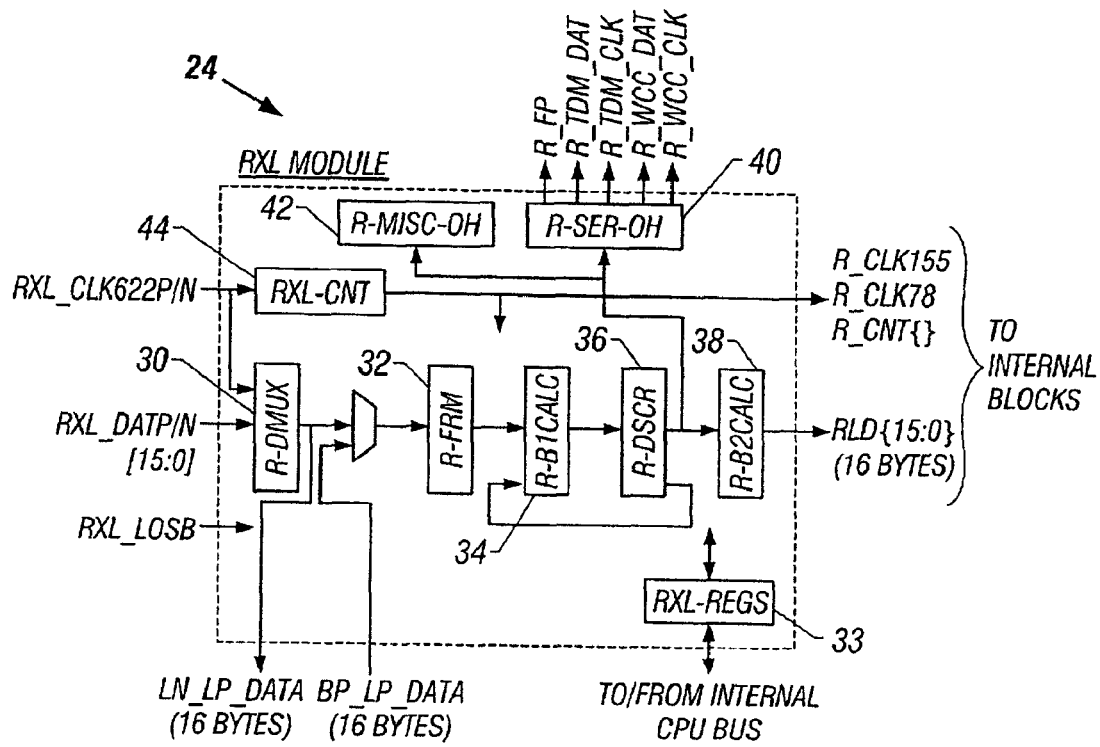
FIG. 4 is a block diagram of a receive line section of the receive module of FIG. 3.

Receive line section 24 of receive module 16 is shown in further detail in FIG. 4. A demultiplexer (R-DMUX) 30 receives the line data RXL_DATP/N[15:0] at 622 MHz. R-DMUX 30 demultiplexes the input data bus from 16-bits down to 16-bytes at 77.76 MHz (its only function is to reduce the data rate). The 16-byte wide, unaligned data stream is supplied to a framer (R-FRM) 32 for frame detection and data alignment, and is also supplied to transmit module 18 as part of the line loopback data path (discussed further below). R-DMUX 30 is preferably built as a custom macro with the ASIC such that data skew and critical timing relationships can be managed for this high-speed block.

Framer 32 searches the unaligned input stream for the framing pattern and provides 16-byte aligned data at its output. R-FRM 32 additionally monitors the status of the input framing process and provides status/error signals to the register subsection. The framing search is performed bit-by-bit (A1/A2 bytes), and R-FRM 32 stays in this bit-search mode until a valid framing pattern has been detected. To acquire frame lock, framer 32 checks 56-bits around the A1/A2 transition boundary (the 56 bits being check may be, e.g., four A1 bytes and three A2 bytes, or three A1 bytes and four A2 bytes). The number of A1's and A2's checked during frame acquisition is dependent on the alignment of the incoming data stream. Framer 32 locks once two successive frames have been detected that match the above criteria. After frame acquisition has occurred, only the $192^{nd}$ A1 byte and the $1^{st}$ A2 byte are checked to maintain frame lock.

Several signals associated with the status framing are generated by framer 32. The loss-of-frame (LOF) output is asserted when the out-of-frame (OOF) condition persists for more than 3 ms. This condition is cleared when an out-of frame indicator is inactive for 3 ms. Multiple timers may be used to detect entering and exiting LOF (the LOF timers use the line rate 77.76 MHz internal clock that has been divided down from the received 622 MHz line input clock). The loss-of-signal (LOS) output is asserted by R-FRM 32 when an all-zeros pattern on the incoming signal lasts 20 $\mu$s or longer. LOS is deasserted when two consecutive valid framing patterns are detected and, during the intervening time (one frame, or 125 $\mu$s), no all-zeros pattern qualifying as an LOS condition is detected (the timer for this function uses a 32 kHz clock input). These various status signals are provided to the receive line registers (RXL-REGS) 33 for visibility to the remainder of the system. These registers are accessed through the internal CPU bus that is common to all blocks in front-end ASIC 12.

A parity byte calculator (R-B1CALC) 34 calculates the B1 parity bytes of the current STS-192 frame. The input to R-B1CALC 34 is the 16-byte aligned data stream from R-FRM 32 (as well as the 8-bit code extracted from the following frame, discussed immediately below in conjunction with the descrambler). The B1 parity check is performed prior to FEC decoding (and any correction), and therefore represents the performance of the raw input signal. B1 parity is calculated bit-wise over all of the bytes in the current STS-192 frame. The output of R-B1CALC 34 is an 8-bit parity value that is compared against the B1 overhead byte from the next received frame. Parity calculation is performed at this stage of the receive pipeline due to descrambling requirements. Parity errors detected by R-B1CALC 34 are turned into a count value of between 0 and 8 per frame. This count value is recomputed for each incoming frame.

All bytes of the STS-192 frame are received in a scrambled form except for the framing bytes (A1, A2), and the trace/growth bytes (J0,Z0). A descrambler (R-DSCR) 36 operates on all bytes in the STS-192 frame, beginning with the first bit of the first byte following the last J0/Z0 byte, and continuing until the end of the frame is reached. In the illustrative embodiment, descrambler 36 is frame synchronous, has a sequence length of 127, and uses the polynomial: $1+x^6+x^7$. R-DSCR 36 is reset to an all 1's pattern on the first bit of the first byte following the last J0/Z0 byte in the first row of the frame. A 16-byte implementation of this polynomial is used for speed reasons.

A B2 parity check is also performed over all bytes of the current STS-192 frame (except for the section overhead bytes) by a B2 calculation circuit (R-B2CALC) 38. The input to R-B2CALC 38 is the 16-byte aligned receive data stream from R-DSCR 36, as well as the 8-bit codes (B2 line overhead bytes) extracted from the incoming signal. B2 parity checking is again performed prior to FEC decoding and correction, and is calculated bit-wise, but is calculated on a per STS-1 basis, such that there are 192 B2 bytes and calculations performed on each received frame. The output of R-B2CALC 38 is thus 192 8-bit parity values that are compared against the B2 overhead bytes from the next received frame. B2 parity calculation is made after the incoming signal is descrambled. Parity errors detected by R-B2CALC 38 are turned into a count value of between 0 and 8 per STS-1, resulting in a total count of from 0 to 1536 per frame. This count value is recomputed for each incoming frame.

Certain overhead bytes may be extracted from the received (OC-192) signal and made available on serial channel ports at the ASIC interface. Two separate channels are provided, one for SONET overhead bytes, and the other for WARP (wavelength router protocol) communications channel bytes, via a serialized overhead module (R-SER-OH) 40. SONET overhead bytes J0, E1, F1, E2, D1–D12 are extracted and sent over a TDM (time-division multiplexed) serial port. These bytes are always extracted from the first STS-1 channel of the received frame. The WARP communications channel extracts bytes as defined by a control register facility, from undefined locations with the SONET D4, D5 and D7 overhead bytes. Bytes extracted (either TDM or WARP) from the current frame are latched and serialized out in the following frame, and any bytes extracted remain in the signal and are supplied to the receive sections of the downstream OC-48 processors 14. Miscellaneous processing of additional SONET overhead bytes may be provided by another module (R-MISC-OH) 42. Such miscellaneous processing may include, for example, K1 and K2 byte processing (from the 1$^{st}$ STS-1 of the incoming STS-192 signal), S1 and M1 byte processing (also from the 1$^{st}$ STS-1 of the incoming STS-192 signal), and J0 message trace buffering (a circular FIFO that accumulates 16 consecutive J0 bytes, one per frame).

The final element of receive line section 24 is a frame position counter (RXL-CNT) 44 which generates the word, column and row count information, as well as the clocks used by the rest of the blocks within the receive path. RXL-CNT 44 receives a synchronization input from R-FRM 32. The word, column and row count information is used by the other blocks in the receive path to determine the current position within the frame being received. Current frame position information is used to demultiplex the incoming signal and process the overhead bytes. Three counters are used, namely, the RL-WRD-CNT which provides a 4-bit count range from 0–11 for the current word, the RL-COL-CNT which provides a 7-bit count range from 0–89 for the current column, and the RL-ROW-CNT which provides a 4-bit count range from 0–8 for the current row. All blocks downstream from RXL 24 (i.e., FDEC 26 and RXD 28) are appropriately offset depending on their relative position in the data pipeline, e.g., if a block is three pipe stages away from the input stage, then it subtracts 3 from the current position to ascertain the correct frame position at its point in the pipeline.

Figure 5:
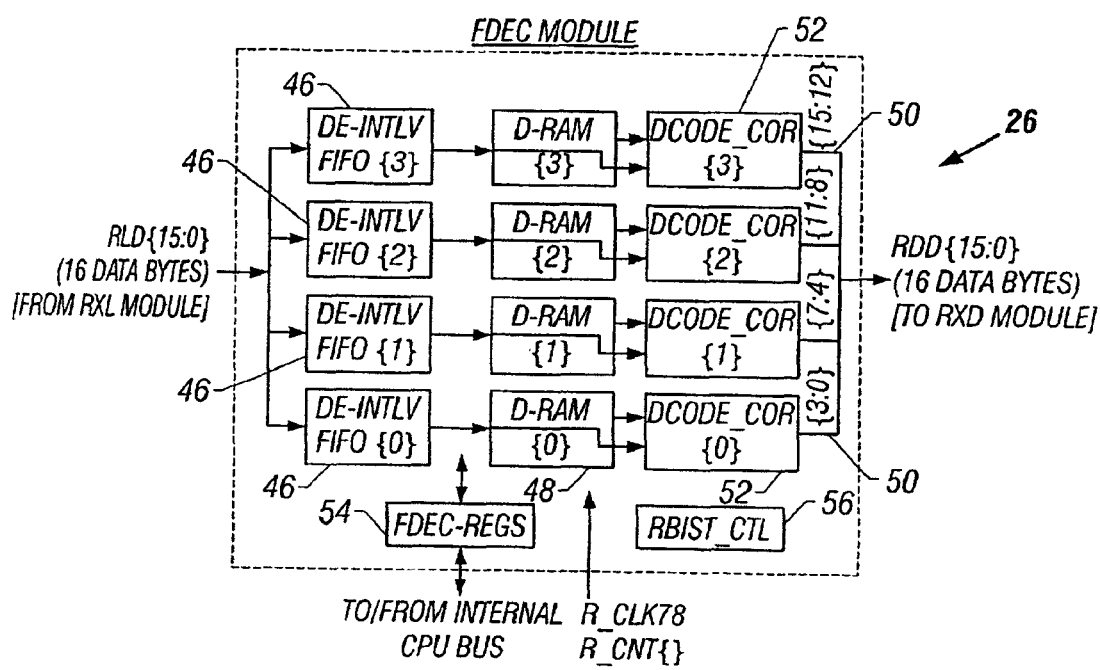
FIG. 5 is a block diagram of a forward error correction (FEC) decoder used in the receive module of FIG. 3.

FEC decoder 26, shown in further detail in FIG. 5, initially de-interleaves the received OC-192 signal into four OC-48 signals. FDEC 26 operates in parallel on the four OC-48 signals to calculate the FEC syndromes and to perform actual bit error correction to the data streams. FDEC 26 runs synchronously using the 77.76 MHz clock signal, and includes random-access memory (RAM) storage blocks 48 to buffer one row of data that is held until all of the correction locations (if any) are found. Four queues (DE-INTLV-FIFO{0 . . . 3}) 46 receive a 16-byte wide data stream directly from the output of RXL 24. Each DE-INTLV-FIFO 46 is 32-bytes, with one read port and one write port, written sequentially 16 bytes at a time, such that each queue receives a 16-byte write operation once every four clock cycles. The read side of queues 46 are accessed four bytes at a time at the same clock speed.

The de-interleaving function is required to separate out the multiplex-ordered SONET signal and to allow the four RXD output ports 50 to be operated in frame alignment to each other. While the four OC-48 streams are de-interleaved from the received signal, the four individual OC-48 signals remain in SONET multiplex order within themselves. If the received signal is an OC-192c signal, it is still necessary to decompose the signal into four de-interleaved sub-signals for correct processing by the downstream OC-48 processors 14. An exemplary SONET channel to OC-48 processor port mapping is shown in Table 1:

TABLE 1

SONET Channel to OC-48 Processor IO Port Mapping (SONET Channel Order)

| SONET Ch. # | RXD/TXD Port # |
|---|---|
| 1–48 | 3 |
| 49–96 | 2 |
| 97–144 | 1 |
| 145–192 | 0 |

Table 2 shows the order of bytes received and transmitted considering the multiplex order on the signal itself.

TABLE 2

SONET Channel to Input/Output Port Mapping (SONET Multiplex Order)

| NT. Mux Order Ch. # | 192 xfr # | RXD/ TXD Port # | SNT. Mux Order Ch. # | 192 xfr # | RXD/ TXD Port # | SNT. Mux Order Ch. # | 192 xfr # | RXD/ TXD Port # | SNT. Mux Order Ch. # | 192 xfr # | RXDI TXD Port # |
|---|---|---|---|---|---|---|---|---|---|---|---|
| 1 | 3A | 3 | 145 | 0A | 0 | 98 | 1C | 1 | 51 | 2E | 2 |
| 4 | | | 148 | | | 101 | | | 54 | | |
| 7 | | | 151 | | | 104 | | | 57 | | |
| 10 | | | 154 | | | 107 | | | 60 | | |
| 13 | | | 157 | | | 110 | | | 63 | | |
| 16 | | | 160 | | | 113 | | | 66 | | |
| 19 | | | 163 | | | 116 | | | 69 | | |
| 22 | | | 166 | | | 119 | | | 72 | | |
| 25 | 3B | | 169 | 0B | | 122 | 1D | | 75 | 2F | |
| 28 | | | 172 | | | 125 | | | 78 | | |
| 31 | | | 175 | | | 128 | | | 81 | | |
| 34 | | | 178 | | | 131 | | | 84 | | |

TABLE 2-continued

SONET Channel to Input/Output Port Mapping (SONET Multiplex Order)

| NT. Mux Order Ch. # | 192 xfr # | RXD/TXD Port # | SNT. Mux Order Ch. # | 192 xfr # | RXD/TXD Port # | SNT. Mux Order Ch. # | 192 xfr # | RXD/TXD Port # | SNT. Mux Order Ch. # | 192 xfr # | RXDI TXD Port # |
|---|---|---|---|---|---|---|---|---|---|---|---|
| 37 | | | 181 | | | 134 | | | 87 | | |
| 40 | | | 184 | | | 137 | | | 90 | | |
| 43 | | | 187 | | | 140 | | | 93 | | |
| 46 | | | 190 | | | 143 | | | 96 | | |
| 49 | 2A | 2 | 2 | 3C | 3 | 146 | 0C | 0 | 99 | 1E | 1 |
| 52 | | | 5 | | | 149 | | | 102 | | |
| 55 | | | 8 | | | 152 | | | 105 | | |
| 58 | | | 11 | | | 155 | | | 108 | | |
| 61 | | | 14 | | | 158 | | | 111 | | |
| 64 | | | 17 | | | 161 | | | 114 | | |
| 67 | | | 20 | | | 164 | | | 117 | | |
| 70 | | | 23 | | | 167 | | | 120 | | |
| 73 | 2B | | 26 | 3D | | 170 | 0D | | 123 | 1F | |
| 76 | | | 29 | | | 173 | | | 126 | | |
| 79 | | | 32 | | | 176 | | | 129 | | |
| 82 | | | 35 | | | 179 | | | 132 | | |
| 85 | | | 38 | | | 182 | | | 135 | | |
| 88 | | | 41 | | | 185 | | | 138 | | |
| 91 | | | 44 | | | 188 | | | 141 | | |
| 94 | | | 47 | | | 191 | | | 144 | | |
| 97 | 1A | 1 | 50 | 2C | 2 | 3 | 3E | 3 | 147 | 0E | 0 |
| 100 | | | 53 | | | 6 | | | 150 | | |
| 103 | | | 56 | | | 9 | | | 153 | | |
| 106 | | | 59 | | | 12 | | | 156 | | |
| 109 | | | 62 | | | 15 | | | 159 | | |
| 112 | | | 65 | | | 18 | | | 162 | | |
| 115 | | | 68 | | | 21 | | | 165 | | |
| 118 | | | 71 | | | 24 | | | 168 | | |
| 121 | 1B | | 74 | 2D | | 27 | 3F | | 171 | 0F | |
| 124 | | | 77 | | | 30 | | | 174 | | |
| 127 | | | 80 | | | 33 | | | 177 | | |
| 130 | | | 83 | | | 36 | | | 180 | | |
| 133 | | | 86 | | | 39 | | | 183 | | |
| 136 | | | 89 | | | 42 | | | 186 | | |
| 139 | | | 92 | | | 45 | | | 189 | | |
| 142 | | | 95 | | | 48 | | | 192 | | |

The order is read by proceeding down the first column ("SNT Mux Order Ch. #") and matching corresponding entries in the second ("192 xfr #") and third ("RXD/TXD Port #") columns, then continuing the order with the fourth, seventh and tenth columns. The columns labeled "192 xfr #" represent the number and designation of bytes transferred at a 155 MHz rate (the speed of the OC-48 side of the circuit). It can be seen from Table 2 that 16 bytes are transferred to/from each OC-48 processor in sequence to make up the OC-192 signal.

Each RAM block 48 is dual ported with a single read port and a single write port, and each is responsible for buffering one OC-48 row of data (90 columns*48 bytes=4320 bytes). RAMs 48 may advantageously be used to support the delay scheme chosen for OC-192 front-end ASIC 12, whereby ½ of the signal delay is incurred in the encoder and ½ is incurred in the decoder. In the chosen delay scheme, some rows require that their bits be placed after their data, necessitating the ability of a row buffer to hold the data until any correction locations can be calculated and applied. RAM blocks 48 can be made sufficiently large to support an FEC scheme that covers the LOH bytes as well.

RAMs 48 provide the de-interleaved signals to four generally identical decode and correction circuits (DCODE-COR) 52, each of which operates on a respective OC-48 signal. DCODE-COR circuits 52 carry out the actual work of error detection and correction, using a unique implementation of a triple-error correcting Bose-Chaudhuri-Hocquenghem (BCH) code referred to as BCH-3 (and discussed in greater detail further below). In carrying out FEC, DCODE-COR circuits 52 generate the appropriate syndromes, create an error polynomial, finds the roots of the error polynomial, and performs any required data correction. The details of error correction are provided further below. DCODE-COR circuits 52 may optionally be provided with multiplexers to allow the FEC functions to be bypassed or disabled. The bit error rate (BER) may be monitored using FEC decoder registers (FDEC-REGS) 54, to cause an interrupt if the received BER exceeds or drops below preset threshold values. These registers 54 can be accessed through the internal CPU bus that is common to all blocks in ASIC 12. A built-in-self-test (BIST) block 56 contains the control circuitry used to perform BIST testing of RAM blocks 48.

Figure 6:
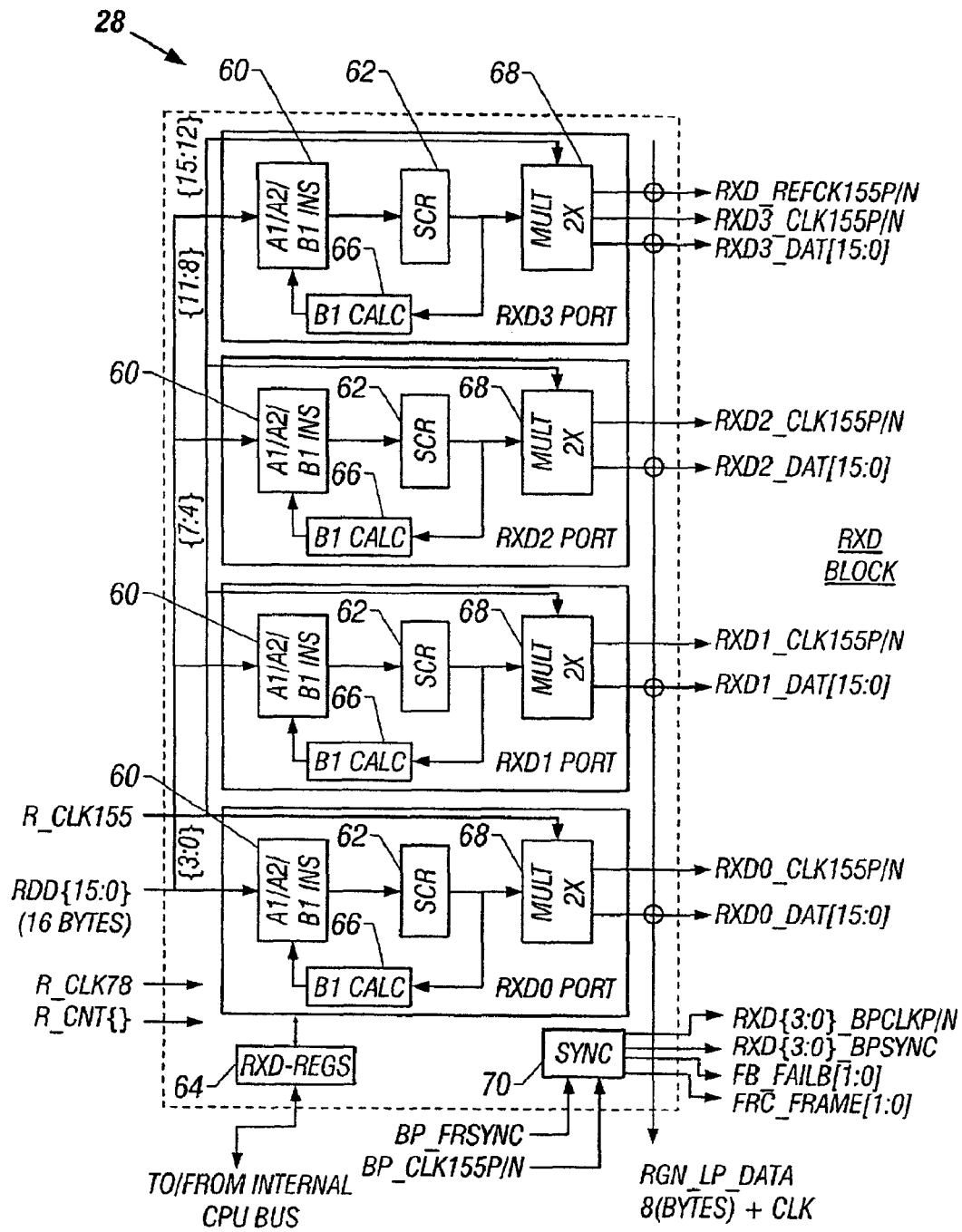
FIG. 6 is a block diagram of a receive demultiplexer section of the receive module of FIG. 3.

The output of the decoding and correction circuits 52 is fed to receive demultiplexer section (RXD) 28, which is shown in further detail in FIG. 6. RXD 28 is responsible for preparing the individual OC-48 signals for delivery to the four downstream OC-48 processors 14. The primary operations performed in RXD 28 are inserting the A1/A2 framing bytes, scrambling the signals, generating and inserting B1 check bytes, and finally multiplying the data rate from the internal 77.76 MHz clock to the external 155.52 MHz clock used by the OC-48 processors. RXD 28 uses the R_CNT{ } frame sequencing information supplied from RXL 24 to determine the current position within the received frames such that bytes can be correctly sequenced in and out of RXD 28. RXD 28 has four replicated ports, each connected externally to a single OC-48 processor, and the logic for each of these ports is identical. The A1/A2/B1 insertion block 60 inserts the A1 and A2 framing bytes into the stream at the appropriate location. This circuit also inserts the B1 byte calculated on the last frame into the appropriate location in the frame. Block 60 receives a dedicated 4-byte (OC-48) input data stream from FDEC 26. The 4-byte wide data stream is input into a scrambler circuit (SCR) 62 which operates over the entire input data stream except for the A1, A2 and J0 byte columns, using a standard SONET polynomial $(1+x^6+x^7)$. Scrambler circuits 62 may optionally be disabled using programmable bits in the RXD control register (RXD-REGS) 64. The 4-byte wide data stream from the scrambler is input to a B1 calculation circuit (B1Calc) 66. B1 calculation is a local (non-SONET) parity check used to determine the integrity of the interface bus between front-end ASIC 12 and OC-48 processors 14. B1 parity is an even parity calculation performed bit-wise over all of the bytes in the transmitted signal (calculated once per frame). The B1 check byte for the current frame is placed in the following frame before scrambling. Additional control bits in the RXD registers 64 may be provided to allow individual B1 bytes to be inverted before being placed in the outgoing frame to verify correct operation of the B1 bytes at the receiving OC-48 processors 14. The 4-byte wide data stream from scrambler 62 is also received at a 2X multiplier block 68 (at 77.76 MHz) and is converted to a 2-byte wide data stream (at 155.52 MHz). The SONET section and line overhead bytes not just mentioned are passed directly from RXL 24 to the outputs of RXD 28 without modification. B2 bytes are not recalculated and, accordingly, can be used by the downstream OC-48 processors 14 to represent a "corrected BER" calculation. A synchronization module (SYNC) 70 contains the logic for miscellaneous functions necessary to synchronize the backplane output ports on the downstream OC-48 processors. SYNC 70 also provides output signals which are used by the downstream OC-48 processors to determine when errors have been detected on the incoming RXL line signal.

Figure 7:
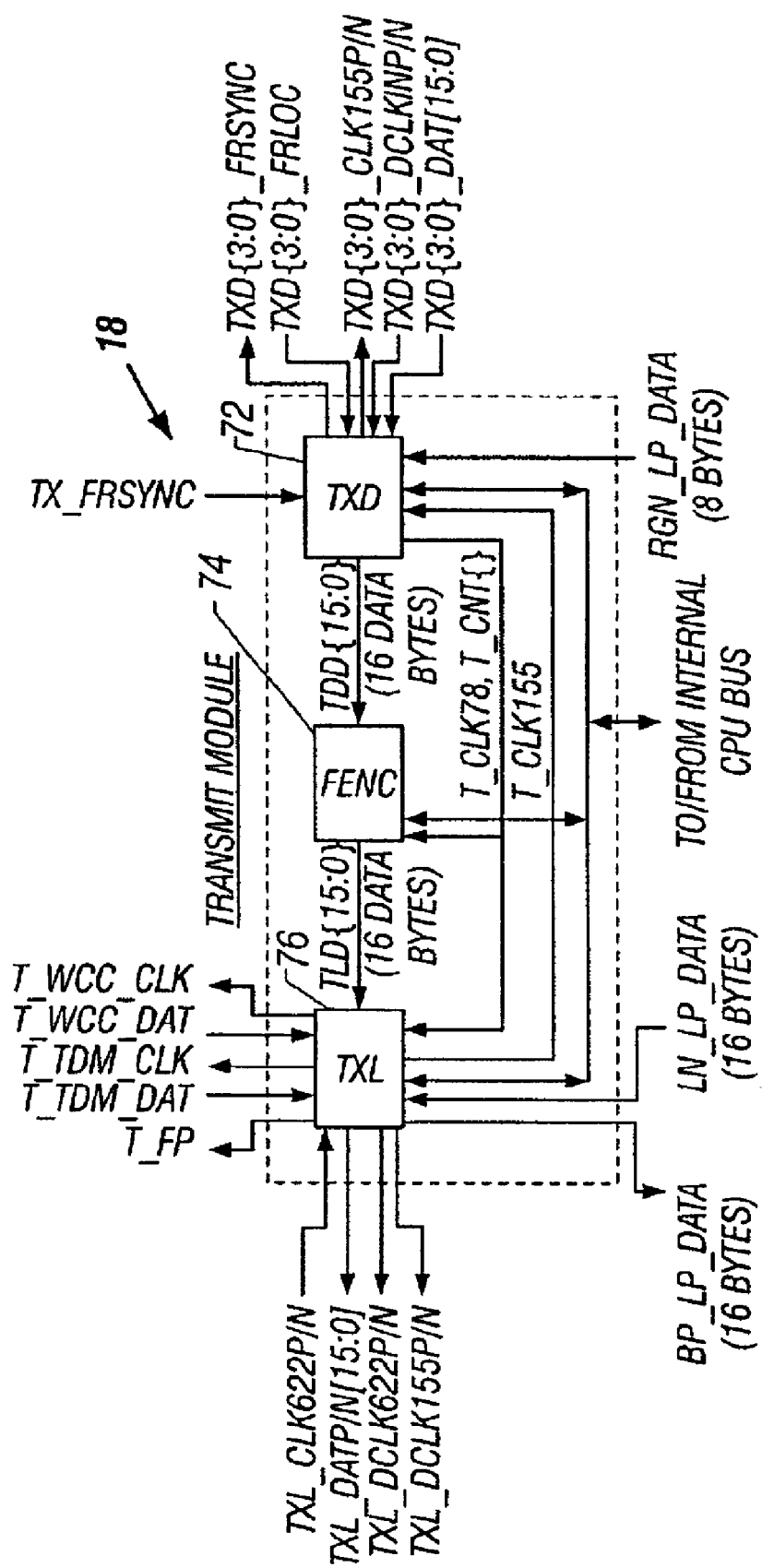
FIG. 7 is a block diagram of a transmit module used in the OC-192 front-end ASIC of FIG. 2.

Returning to FIG. 2, transmit module 18 implements the receiving of the four OC48 signals from OC-48 processors 14, generates FEC check bytes, interleaves the four OC-48 signals into a single raw OC-192 signal, and generates and inserts the section and line overhead bytes to create a complete OC-192 signal for transmission onto the SONET line. Transmit module 18 is shown in further detail in FIG. 7, and includes a transmit demultiplexer section (TXD) 72, an FEC encoder (FENC) 74, and a transmit line section (TXL) 76. Data flows through transmit module 18 from the right in FIG. 7 (the demultiplexed input), to the left (SONET line signal). The CPU interface to transmit module 18 allows for software access to the configuration and status information associated with the module. Besides the primary chip I/O signals connected to transmit module 18, there are also several inputs that are routed to receive module 16 for error reporting and diagnostic loopback functions.

Figure 8:
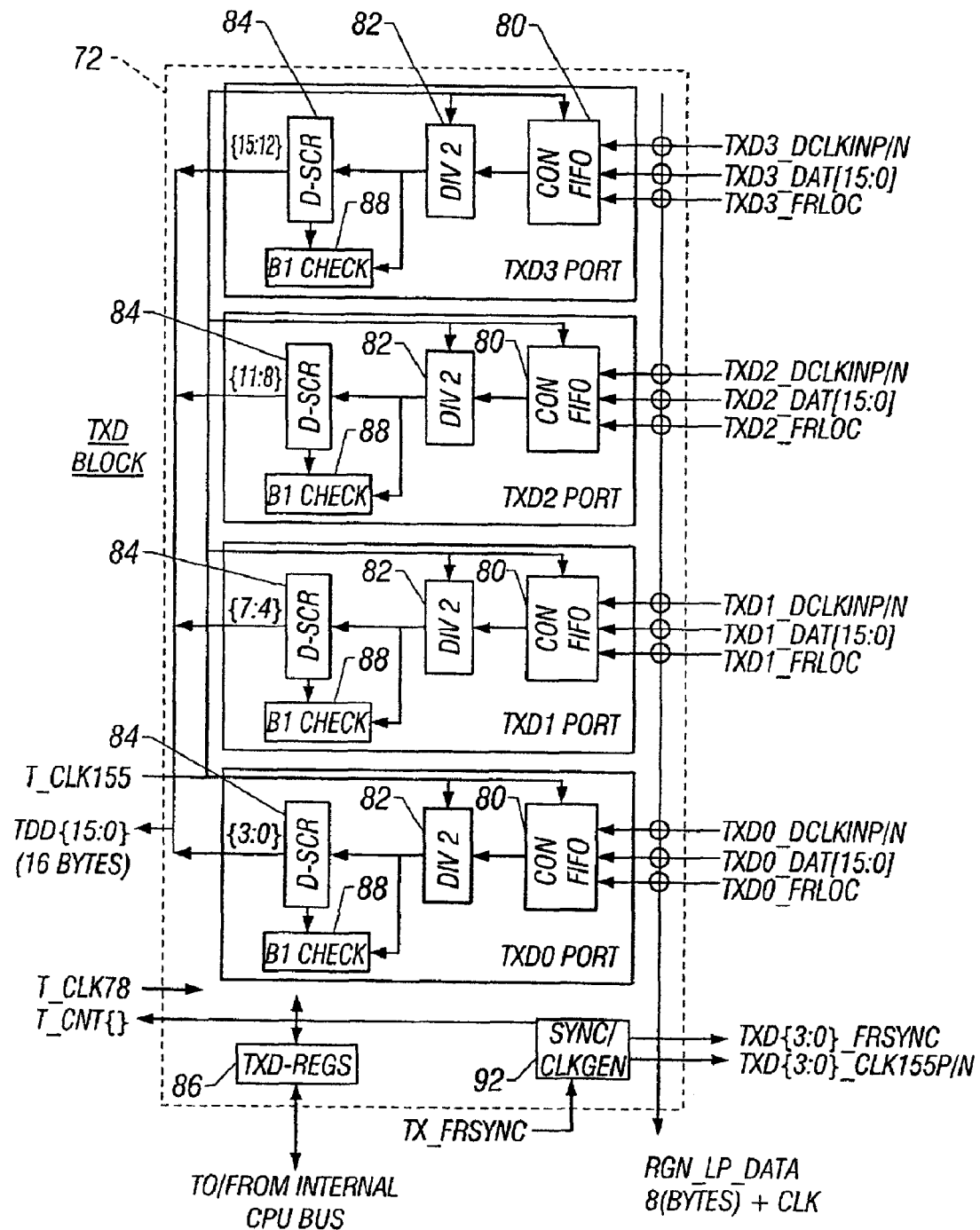
FIG. 8 is a block diagram of a transmit demultiplexer section of the transmit module of FIG. 7.

Transmit demultiplexer section 72 of transmit module 18 is shown in further detail in FIG. 8. TXD 72 receives four OC-48 signals from the four upstream OC-48 processors 14, frame aligns the input streams, descrambles them, performs a B1 check, and performs a data rate conversion from 155.52 MHz down to 77.76 MHz. TXD 72 contains four replicated ports from the individual OC-48 processors, which feed into respective contra FIFO queues 80. Each contra FIFO queue 80 is 5-entry by 17 bits, and includes 16 bits of data plus the frame location pulse. Queues 80 allow for phase drift of the incoming TXC{ }_DCLKIN clock signal that is used to clock in the TXD{ }_DAT{15:0} data. Each queue 80 has one read port and one write port. The TXD{ }_FRLOC inputs are used to align the incoming data streams from the four OC-48 processors 14.

The read side of a contra FIFO queue 80 is fed to a divide-by-two (DIV 2) data rate changer 82. The output of DIV 2 block 82 is a 32-bit wide data stream at 77.76 MHz. This data stream is input into a descrambler 84 which operates over the entire input data stream except for the A1, A2 and J0 byte columns. Descrambler 84 employs a standard SONET polynomial. Descrambler 84 may optionally be disabled using programmable bits in the TXD registers (RXD-REGS) 86.

The 32-bit wide data stream from DIV 2 block 82 is also provided to a B1 checking circuit (B1 Check) 88. An error count ranging between 0 and 8 is calculated each frame and accumulated in a register in TXD registers 86. Any time this register is updated (indicating that at least one parity error has occurred) a status bit and interrupt are generated in additional registers in TXD registers 86.

A frame position counter (TXD-CNT) 90 generates the word, column and row count information used by the rest of the blocks within transmit module 18. TXD-CNT 90 receives a sync input from the alignment circuit for the four TXD input ports, so that its position can be started correctly. Current frame position is used to multiplex the outgoing signal, and to place the overhead bytes in the outgoing signal. Three counters are used, similar to those used by RXL-CNT 44. Outgoing data from TXD 72 is 16-byte aligned. Specific STS-1 channels are located by monitoring the word count value and by knowledge of which STS-1 signal resides in each byte lane of the 16-byte wide input signal path. All blocks downstream from TXD 72 (i.e., FENC 74 and TXL 76) are appropriately offset depending upon their position in the data pipeline.

TXD 72 also includes logic (SYNC/CLKGEN) with frame position counter 90 to synchronize the four upstream OC-48 processors 14. Synchronization logic supplies OC-48 processors 14 with the 155 MHz clock inputs, via a dedicated set of I/O pins for each processor. Those outputs (TXD{ }_CLK155P/N) are a buffered, matched version of the T_CLK155 signal supplied from TXL 76. Frame synchronization pins are also provided to allow for placement of the framing location on the TXD ports, based on a synchronization input (TX_FRSYNC) which may be a free running signal with a 125 μs period. This feature is optional and may be disabled via a control register in TXD-REGS 86; if disabled, the TXD ports are still synchronized across all four OC-48 processors 14, but the synchronization point is random. Relatively precise timing is required to operate the TXD ports properly. Timing of the overall system is discussed further below in conjunction with FIG. 11.

Figure 9:
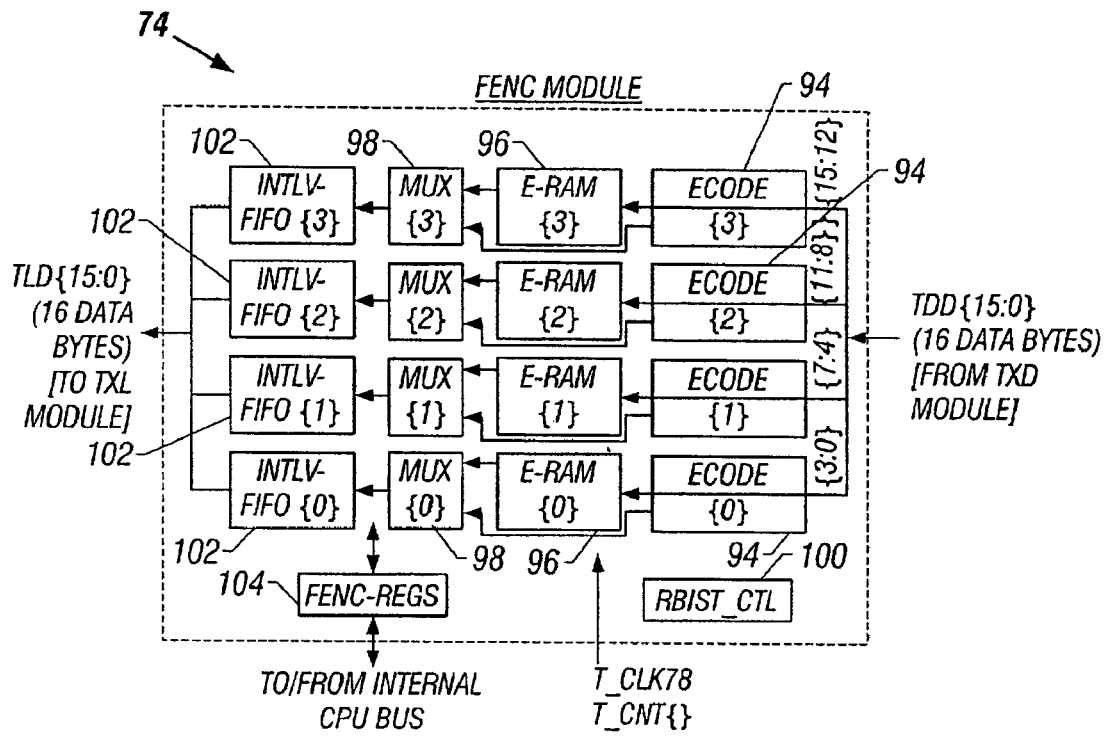
FIG. 9 is a block diagram of an FEC encoder circuit for the transmit module of FIG. 7.

FEC encoder 74, shown in further detail in FIG. 9, calculates and inserts check bits on the OC-48 signals received from the four TXD input ports. FENC 74 operates in parallel on the four OC-48 signals, with each signal initially received by a respective encoding (ECODE) circuit 94. Encoding circuits 94 generate the actual check bits. Due to the bit-wise interleaving of the FEC code across the OC-48 bytes, ECODE circuits 94 process eight individual bit streams simultaneously, with each circuit receiving 4-bytes per clock such that each of the 8-bit streams is being processed in a 4-bit parallel manner (i.e., each of the eight bit streams supplies four bits per clock to each ECODE 94). Each circuit 94 supplies a 39-byte check code output for each row of SONET data received, and retains the calculated check bytes until needed by further down the transmit path (by multiplexers 98).

The four OC-48 signals are received in multiplex order from TXD 72, and FEC coding is performed directly on the OC-48 multiplexed signals. The signals are buffered with RAM storage blocks 96 operating at a 77.76 MHz synchronous clock rate. Each RAM block 96 is dual ported with a single read port and a single write port, and each buffers one OC-48 row of data (90 columns*48 bytes=4320 bytes). RAMs 96 are again used to support the delay scheme chosen for OC-192 front-end ASIC 12, whereby ½ of the signal delay is incurred in the encoder and ½ is incurred in the decoder. In the chosen delay scheme, some rows require that their bits be placed ahead of their data, necessitating the ability of a row buffer to hold the data. Multiplexers 98 combine the data and the check bytes together to create the composite output signals. A built-in-self-test (BIST) block 100 contains the control circuitry used to perform BIST testing of RAM blocks 96.

Four queues (INTLV-FIFO) 102 assist in the interleaving of the four OC-48 composite signals from multiplexers 98 to form a single OC-192 signal to be delivered to TXL 76. Each interleave queue 102 is 32-byte first-in-first-out, with one read port and one write port. The write port (supplied from a multiplexer 98) is accessed 4-bytes at a time at 77.76 MHz. The read side of the queues are accessed 16-bytes at a time at 77.76 MHz, and are read in sequence to supply the single (multiplex ordered) OC-192 rate signal on the internal transmission line bus. Interleaving is performed according to the scheme set forth in Tables 1 and 2 above. Although FENC 74 has no status or interrupt registers (in this particular embodiment of the invention), other registers (such as a control register and inband register) can be provided in the encoder registers (FENC-REGS) 104. The inband register may be used to define an FSI (FEC status indication) status word for controlling the downstream FEC decoder that is receiving the FEC encoded signal, to denote that valid check bits have been placed in the outgoing signal. The receiver can check the incoming FSI status word and will not attempt FEC correction on the signal unless the correct value is detected in the FSI location.

Figure 10:
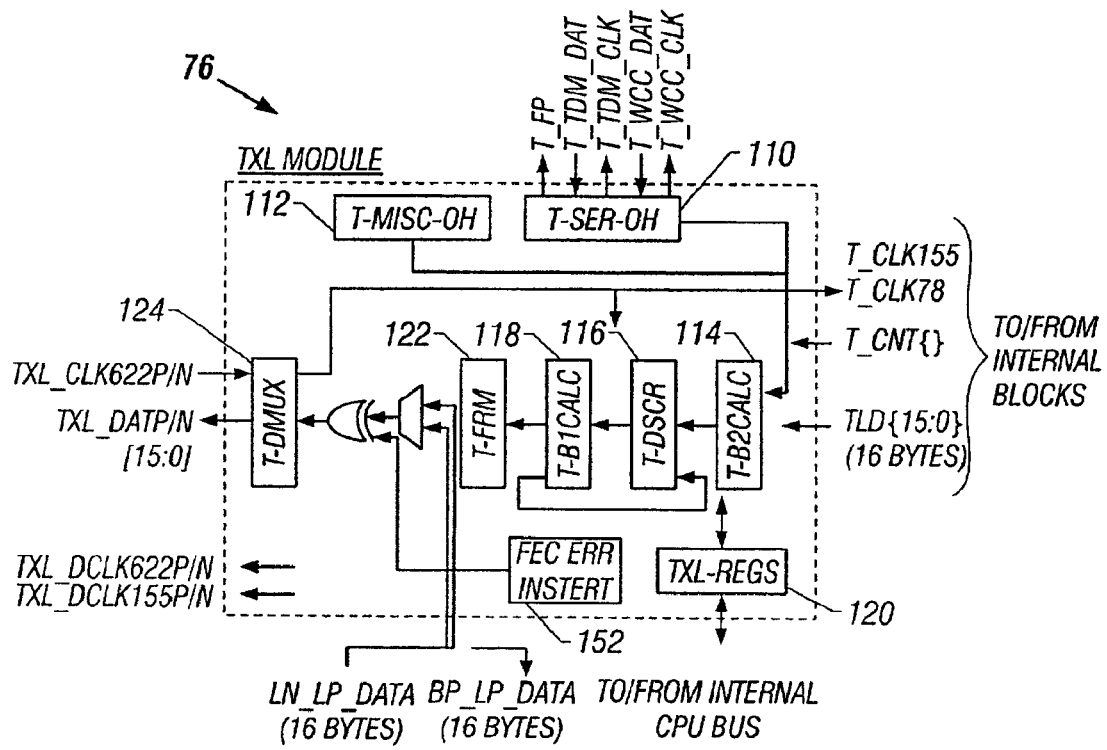
FIG. 10 is a transmit line section of the transmit module of FIG. 7.

TXL 76, which is shown in further detail in FIG. 10, receives the OC-192 signal from FENC 74, and inserts overhead bits, calculates parity, scrambles the signal, and multiplexes the signal down from the internal 16-byte/77.76 MHz data format. TXL 76 also generates the clocks needed by the rest of the logic in the transmit path. Certain overhead bytes are inserted after having been received on serial channel ports via a serial interface (T-SER-OH) 110. As discussed above, two separate serial channels are provided, one for SONET overhead bytes, and the other for WARP communications bytes. The following SONET overhead bytes are serialized over the TDM serial port and inserted in the first STS-1 channel of the transmitted OC-192 signal: J0, E1, F1, E2, D1–D12. The foregoing bytes may optionally be supplied as received from the upstream OC-48 processors in a pass-through mode of operation. The WARP communications channel inserts bytes as defined by a control register facility, from undefined locations with the SONET D4, D5 and D7 overhead bytes. Bytes serialized in the current frame (either TDM or WARP) are latched and inserted in the transmit signal in the following frame. Miscellaneous processing of additional SONET overhead bytes may be provided by another module (T-MISC-OH) 112. Such miscellaneous processing may include, for example, K1 and K2 byte insertion (from the 1$^{st}$ STS-1 of the outgoing STS-192 signal), S1 and M1 byte insertion (also from the 1$^{st}$ STS-1 of the outgoing STS-192 signal), and J0 message trace buffering.

The 16-byte aligned receive data stream from FENC 74 is passed to a B2 parity byte calculator (T-B2CALC) 114, along with the overhead bytes inserted from T-MISC-OH 112 and T-SER-OH 110. B2 parity is calculated over all bytes of the current STS-192 frame except for the section overhead bytes, after insertion of the FEC check bytes. B2 parity is calculated bit-wise on a per STS-1 basis, such that there are 192 B2 bytes calculated for each transmitted frame. The B2 check bytes for the current frame are placed in the B2 byte locations of the following frame.

A scrambler (T-SCR) 116 scrambles all bytes in the outgoing SONET data stream except for the framing bytes (A1,A2) and the J0/Z0 trace/growth bytes (i.e., the first three columns of the frame). Scrambler 116 is frame synchronous, has a sequence length of 127, and uses the standard polynomial $1+x^6+x^7$. T-SCR 116 is reset to an all 1's pattern on the first bit of the first byte following the last J0/Z0 byte in the first row of the frame. A 16-byte implementation of this polynomial is again used for speed reasons.

The 16-byte wide data stream from T-SCR 116 is input to a B1 parity byte calculator (T-B1CALC) 118. B1 parity calculation is an even parity performed bit-wise over all of the bytes in the transmitted signal. B1 parity is calculated once per frame, and performed on the data after scrambling. The B1 check byte for the current frame is placed in the following frame (before scrambling). A control bit may be provided in the TXL registers (TXL-REGS) 120 to allow the B1 byte to be inverted before being placed in the outgoing frame, to verify correct operation of the B1 byte at the receiving device.

A frame generation module (T-FRGEN) 122 adds the A1 and A2 framing bytes to the data signal before it is sent to a transmission multiplexer (T-MUX) 124. T-MUX 124 receives the 16-byte data stream and multiplies it up to the 16-bit 622 MHz data rate for output on the transmit line data bus. In the loopback mode, T-MUX 124 can receive an unaligned 16-byte data stream from RXL 24. T-MUX 124 also generates the internal system rate clocks used by the remainder of the transmit module 18, by dividing the incoming 622 MHz signal by eight.

To further facilitate a thorough understanding of the handling, extraction, and generation of the overhead bytes, the different types of overhead bytes are now explained. The A1 and A2 bytes represent the framing bytes in the SONET frame. A1 and A2 bytes are used for framing the input signal and are regenerated in the RXD block before the signal is passed to the downstream OC-48 processors. The transmitted A1 and A2 bytes are inserted by the TXL block before the OC-192 signal is driven out of the device. There are no options for modifying the transmitted A1, A2 bytes.

The J0 byte is only defined for the first STS-1 channel of the OC-192 signal. The received J0 byte is supplied to the J0 Trace Buffer, externally on the R_TDM serial bus and is passed through the device to the downstream OC-48 processors. The received information in the 191 "undefined" channel locations is passed through the device and made available to the downstream OC-48 processors. The transmitted J0 byte has multiple sources. The J0 byte (in the first STS-1 channel) may be supplied from the T_TDM serial input channel, the internal J0 Transmit Message Buffer or from the upstream OC-48 processor. The EN_J0_BUF bit in the TXL_CR control register determines whether the internal source of the J0 byte is from the TDM serial bus or from the Transmit Message Buffer. The SC__MSTR bit in the TXL__OH__CR control register determines whether the J0 byte is supplied internally or whether the type is supplied as passed in from the TXD{3} input port. The J0 byte positions in SONET channels 49, 97, and 145 may be passed through from the TXD {2.0} input ports or are fixed to a constant value of 0xCC. The SC-SLV bi8t in the TXL__OH__CR control register determines the source of the J0 byte by for channels 49, 97, and 145. The remaining transmit J0 channels (all channels other than 1, 49, 97, and 145) are fixed to a constant hex value of 0xCC.

The B1 parity byte is defined only in the first STS-1 of the OC-192 signal. The received B1 byte is used to calculate the incoming B1 parity. Four B1 bytes are calculated and inserted (in channels 1, 49, 97, and 145) in the four outgoing OC-48 signals on the demux side of the device. The remaining 188 received B1 byte channels are passed through the front-end ASIC device to the downstream OC-48 processors. The transmitted B1 byte (in the first STS-1 channel) is always calculated and inserted by the front-end ASIC device. The remaining 191 channels are either fixed to a constant of zero or are the pass-through of the values received on the TXD {3.0} input ports. The SC__OTHR bit in the TXL__OH__CR control register determines whether the undefined B1 locations are zero or pass-through.

The E1 byte is defined for the first STS-1 of an OC-192 signal. The received first channel E1 byte is made available on the TDM serial channel output as well as being passed through to the downstream OC-48 processor. The remaining 191 channels of E1 byte are passed through to the downstream OC-48 processors. Certain locations of the E1 column are reserved for use for FEC check bits. The received locations reserved for FEC check bits will have bit errors in their positions corrected by the FEC unit before being passed to the downstream OC-48 processors. The transmitted E1 byte locations are controlled by five separate bits in the TXL__OH__CR control register. The first STS-1 channel location is inserted from the input TDM serial channel or from the TXD{3} input port depending on the state of the SC-MSTR bit in the TXL__OH__CR control register. The remaining E1 byte locations (channels 2–192) are controlled by the FEC, FEC_1B, SC__SLV and SC__OTHR bits in the TXL__OH__CR control register.

The F1 byte is defined for the first STS-1 of an OC-192 signal. The received first channel F1 byte is ma e available on the TDM serial channel output as well as being passed through to the downstream OC-48 processor. The remaining 191 channels of F1 byte are passed through to the downstream OC-48 processors. Certain locations of the F1 column are reserved for use for FEC check bits. The received locations reserved for FEC check bits will have bit errors in their positions corrected by the FEC unit before being passed to the downstream OC-48 processors. The transmitted F1 byte locations are controlled by five separate bits in the TXL__OH__CR control register. The first STS-1 channel location is inserted from the input TDM serial channel or from the TXD{3} input port depending on the state of the SC-MSTR bit in the TXL__OH__CR control register. The remaining F1 byte locations (channels 2–192) are controlled by the FEC, FEC_1B, SC__SLV and SC__OTHR bits in the TXL__OH__CR control register.

The D1–D3 bytes are defined for the first STS-1 of an OC-192 signal. The received first channel D1–D3 bytes are made available on the TDM serial channel output as well as being passed through to the downstream OC-48 processor. The remaining 191 channels of D1–D3 bytes are passed through to the downstream OC-48 processors. Certain locations of the D1–D3 columns are reserved for use for FEC check bits. The received locations reserved for FEC check bits will have bit errors in their positions corrected y the FEC unit before being passed to the downstream OC-48 processors. The transmitted D1–D3 byte locations are controlled by four separate bits in the TXL__OH__CR control register. The first STS-1 channel location is inserted from the input TDM serial channel or from the TXD{3} input port depending on the state of the SC-MSTR bit in the TXL__OH__CR control register. The remaining D1–D3 byte locations (channels 2–192) are controlled by the FEC, SC__SLV and SC__OTHR its in the TXL__OH__CR control register.

The H1–H3 bytes are defined for all channels in the OC-192 signal. The H1–H3 bytes are not processed at all in the front-end ASIC device but are passed through to the downstream OC-48 processors. The transmitted H1–H3 bytes are normally sourced from the TXD{3:0} input ports. The H1–H3 bytes are processed by the upstream OC-48 processors. The front-end ASIC device does, however, have the capability of forcing the H1–H3 bytes to a path-AIS state (all 1's in all bytes) on an OC-48 signal granularity. The path-AIS forcing of the H1–H3 bytes (in the transmit path) may be performed explicitly through the FRC__PAIS[3:0] bits in the TXD__CR control register or may be performed automatically by the front-end ASIC device upon detection of an error on the TXD{3:0} input ports. All of the bits of the TXD{3:0} input ports (the 16 data bits, the input clock and the input frame sync signal) are monitored for activity. If any of these bits ceases to be active, then the path-AIS condition is forced across that particular OC-48 input. If the front-end ASIC device is transmitting an OC-192c signal (as detected by the T_192C_DETB input), then a loss-of-activity failure on any TXD{3:0} input port will cause path-AIS to be inserted on all four of the input ports. The automatic path-AIS insertion function may be optionally disabled by the DIS__LOAPTH bit in the TXD__CR control register.

The B2 parity byte is defined for all 192 channels of the OC-192 signal. The received B2 parity bytes are used to calculate the incoming parity. The received B2 bytes are also passed through unmodified in the C48 output signals. The transmitted B2 bytes are controlled by the B2 bit in the TXL__OH__CR control register. The B2 control bit allows the outgoing B2 bytes to be recalculated by the front-end ASIC device or to be passed through unmodified from the values received on the TXD{3:0} input ports.

The K1, K2 bytes are defined for the first STS-1 of an OC-192 signal. The received first channel K1, K bytes are made available in the TXL__KIK2 register as well as being passed on to the downstream OC-48 processor. The remaining 191 channels of the K1, K2 bytes are passed through to the downstream OC-48 processors. Certain locations of the K1, K2 columns are reserved for use for FEC check bits. The received locations reserved for FEC check bits will have bit errors in their positions corrected by the FEC unit before being passed to the downstream OC-48 processors. The transmitted K1, K2 byte locations are controlled by four separate bits in the TXL__OH__CR control register. The first STS-1 channel location is inserted from the input TDM serial channel or from the TXD{3} input port depending on the state of the LN__MSTR bit in the TXL__OH__CR control register. The remaining K1, K2 byte locations (channels 2–192) are controlled by the FEC, LN__SLV and LN__OTHR bits in the TXL OH CR control register.

The D4–D12 bytes are defined for the first STS-1 of an OC-192 signal. The received first channel D4–D12 bytes are made available on the TDM serial channel output as well as being passed through to the downstream OC-48 processor. The remaining 191 channels of D4–D12 bytes are passed through to the downstream OC-48 processors. Certain locations of the D4–D12 columns are reserved for use for FEC check bits and the Warp communications channel. The received locations reserved for FEC check bits will have bit errors in their positions corrected by the FEC unit before being passed to the downstream OC-48 processors. The transmitted D4–D12 byte locations are controlled by five separate bits in the TXL_OH_CR control register. Additionally, values set in the WCCR control register affect the contents of the outgoing D4–D12 byte columns. The first STS-1 channel location is inserted from the input TDM serial channel or from the TXD{3} input port depending on the state of the LN_MSTR bit in the TXL_OH_CR control register. The remaining D4–D12 byte locations (channels 2–192) are controlled by the FEC, WARP, LN_SLV and LN_OTHR bits in the TXL_OH_CR control register.

The S1, M1 bytes are defined for the first STS-1 (third for M1) of an OC-192 signal. The received first channel S1, M1 bytes are made available in the TXL_S1M1 register as well as being passed on to the downstream OC-48 processor. The remaining 191 channels of the S1, M1 bytes are passed through to the downstream OC-48 processors.

The transmitted S1, M1 byte locations are controlled by the LN_OTHR bit in the TXL_OH_CR control register. The source of the S1 and M1 bytes in channels 2–192 may be either forced to zero or pass through from the TXD{3:0} input ports.

The E2 byte is defined for the first STS-1 of an OC-192 signal. The received first channel E2 byte is made available on the TDM serial channel output as well as being passed through to the downstream OC-48 processor. The remaining 191 channels of E2 byte are passed through to the downstream OC-48 processors. Certain locations of the E2 column are reserved for use for FEC check bits. The received locations reserved for FEC check bits will have bit errors in their positions corrected by the FEC unit before being passed o the downstream OC-48 processors. The transmitted E2 byte locations are controlled by four separate bits in the TXL_OH_CR control register. The first STS-1 channel location is inserted from the input TDM serial channel or from the TXD{3} input port depending on the state of the LN_MSTR bit in the TXL_OH_CR control register. The remaining E2 byte locations (channels 2–192) are controlled by the FEC, LN_SLV and LN_OTHR bits in the TXL_OH_CR control register.

A facility is included in the section and line overhead bytes to allow communication between OC-48 processors located on different line cards or in different systems. This feature is included in the case that it is ever necessary to send messages all the way to the OC-48 processors on an OC-192 line card. (Additionally, this feature allows access to multiple, alternate serial communications channels by utilizing the currently unused serial channels existing on the OC-48 processors in an OC-192 line card.) The byte positions that allow for OC-48 processor to OC-48 processor communication do so only in the locations defined for the OC-48 masters (i.e. channels 1, 49, 97 and 145). Bytes that fall into this category include: J0, E1, F1, D1–D3, K1, K2, D4–D12 and E2.

Figure 11:
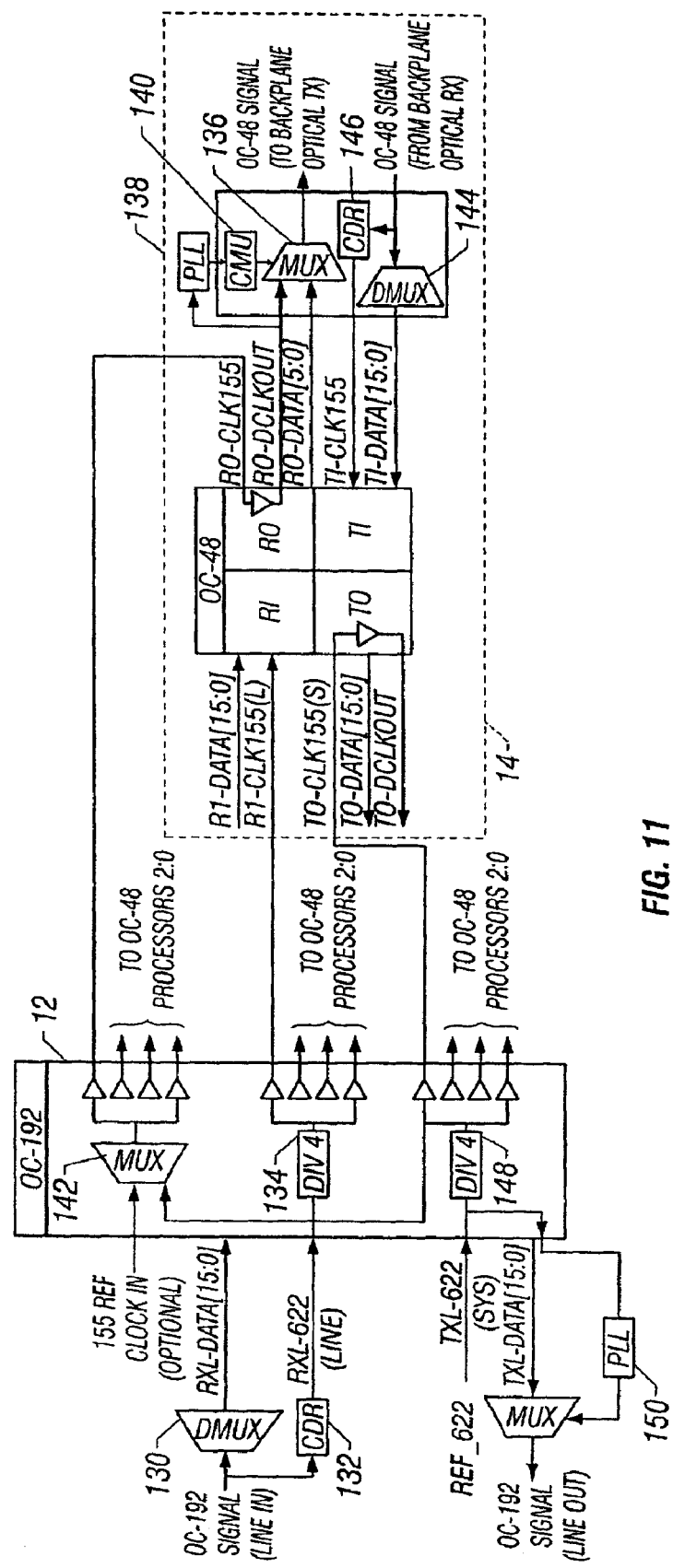
FIG. 11 is a high-level schematic diagram illustrating the timing connections between the OC-192 front-end ASIC shown in FIG. 1 and the four OC-48 processors in FIG. 1.

The clocking connections between front-end ASIC 12 and OC-48 processors 14 are illustrated in FIG. 11. Front-end ASIC 12 divides by four both the line clock rate and the system clock rate. These divide-by-four line and system clocks are then supplied, in parallel, to the four OC-48 processors 14. No contra clocking mechanism is provided in the receive-input (RI) ports of the OC-48 processors. On the receive side, the OC-192 input signal is supplied to a demultiplexer 130, which extracts the SONET data and feeds it to front-end ASIC 12, and to a clock data recovery (CDR) 132 which extracts the 622 MHz clock signal. The 622 MHz clock signal is input to a divide-by-four circuit (Div 4) 134 having four outputs which fan out to the four OC-48 processors. A given one of these lines connects to the RI port of the respective OC-48 processor 14. This divided-by-four clock signal is passed to the optical backplane from the receive-output (RO) port of the OC-48 processor. The clock signal is supplied along with the data to a multiplexer 136, and to a phase-lock loop (PLL) 138. PLL 138 controls a clock multiply unit (CMU) 140 whose output is connect to the select input of multiplexer 136. A 155 MHz input signal is optionally provided to front-end ASIC 12, which is selectable using another multiplexer 142. This signal is similarly fanned out to the OC-48 processors. On the transmit side, the OC-48 signal from the optical backplane is provided to another demultiplexer 144 and to another CDR 146 at the transmit-input (TI) port of a given OC-48 processor 14. A reference 622 MHz signal is provided to the transmit-output (TO) port via another divide-by-four circuit 148. Another PLL 150 receives the reference signal, and is used to synchronize the multiplexer which passes the OC-192 signal to the line out. Those skilled in the art will appreciate that many alternative timing schemes can be used in conjunction with the present invention.

To further ensure a thorough understanding of the interconnection of the various components of OC-192 I/O card 10, each input and output pin for each component is listed along with its description in the attached Appendix.

As explained above, front-end ASIC 12 incorporates forward error correction (FEC) circuitry in both the receive and transmit paths. In the illustrative embodiment of the present invention, an "in-band" FEC solution is implemented using some of the undefined byte locations in the SONET signal to hide the check bytes needed. In this manner, the native signal rate is retained, and interoperability with non-FEC enabled network elements can be accomplished (FEC is disabled). However, the present invention may be implemented with out-of-band solutions as well.

The total delay associated with FEC for front-end ASIC 12 is "split" between the FEC encoder 74 and FEC decoder 26, such that one-half of the delay arises from encoding and one-half of the delay arises from decoding, by placing some of the FEC check bits at the front of the row to which they belong (i.e., the encoder stores and holds a row's worth of data while it calculates the check bits to be placed at the front of the row ahead of the data). The decoder also incurs a row delay since it must have received all of the check bits and the data before it can determine where corrections are needed and actually make the corrections. This approach is advantageous where intermediate FEC is desired, such as at a regenerator, because the regenerator will only incur one row time (about 13.88 $\mu$s) of delay instead of the full two rows of delay that would otherwise occur.

Overhead byte columns used for FEC are columns for which generally only the first STS-1 location is defined for use. In an OC-192 signal, this leaves 191 byte locations (per row) available for FEC check bytes. As explained further below, the FEC algorithm used in front-end ASIC 12 requires 39 FEC check bytes per OC-48 per row, i.e., a total of 156 FEC check bytes per row. An acceptable scheme for columns locations for FEC check bytes is shown in Table 3:

TABLE 3

Column Locations of FEC Check Bytes for Each Row.

| SONET Row | Transport Overhead | | |
|---|---|---|---|
| 1 | A1 | A2 | J0 |
| 2 | B1 | E1 | F1 |
|   |    | FEC Row 1 | FEC Row 2 |
| 3 | D1 | D2 | D3 |
|   |    | FEC Row 3 |    |
| 4 | H1 | H2 | H3 |
| 5 | B2 | K1 | K2 |
|   |    | FEC Row 4 | FEC Row 5 |
| 6 | D4 | D5 | D6 |
|   |    |    | FEC Row 6 |
| 7 | D7 | D8 | D9 |
|   |    | FEC Row 7 |    |
| 8 | D10 | D11 | D12 |
|   |    |    | FEC Row 8 |
| 9 | S1 | M0 | E2 |
|   |    |    | FEC Row 9 |

As mentioned above, front-end ASIC 12 uses a form of FEC which is based on BCH (Bose-Chaudhuri-Hocquenghem) codes, more particularly, a triple-error correcting code generically referred to as BCH-3. The present invention is directed to a unique implementation of a BCH-3 code. In an exemplary version of this implementation, the code effectively is (4215, 4176), i.e., the block length n (the length of the message bits plus the additional check bits) is 4215 bits, and the message length k (the number of data bits included in a check block) is 4176 bits. Actually, this is a "shortened" code, handled within the parent code which is (8191,8152), but it is assumed that all unused message bits are zeros. Thus, in either case, there are 39 check bits. The generator polynomial used is $g(x)=\phi_1(x)\phi_3(x)\phi_5(x)$, where:

$\phi_1(x)=x^{13}+x^4+x^3+x+1$, $\phi_3(x)=x^{13}+x^{10}+x^9+x^7+x^5+x^4+1$, and $\phi_5(x)=x^{13}+x^{11}+x^8+x^7+x^4+x+1$.

BCH encoding is accomplished using FENC 74 or, more specifically, encoding circuits 94 as explained above. The generator polynomial is applied such that the resulting code word divided by g(x) will have a zero remainder. If the message portion of the code word is denoted u(x), then the remainder b(x) that is left after dividing the code word by the generator polynomial may be expressed as b(x)=u(x)mod[g(x)]. This remainder b(x) represents the actual check bits. Encoding circuits 94 implement this equation using a linear feedback shift register (LFSR) circuit, such as that depicted in figure 4.1 of "Error Control Coding: Fundamentals and Applications," by Shu Lin and Daniel J. Costello, p. 95. The LFSR must, however, operate in 4-bit parallel fashion.

BCH decoding is accomplished using FDEC 26 or, more specifically, decoding circuits 52 as explained above. The decoding process can be divided into three general steps, namely, the computation of the syndromes, error polynomial generation, and then error correction. The syndrome computations contemplated herein are generally conventional. There are 2t (or, for the present implementation, 6) syndromes that are related to the received code word r(x) by the equation $S_i=r(\alpha^i)$. The received code word r(x) can further be represented as $r(x)=a_i\phi_i(x)+b_i(x)$, where b(x) is the remainder from dividing r(x) by $\phi_i(x)$ ($\phi_i(x)$ is a minimal polynomial). Since, by definition, $\phi_i(\alpha^i)=0$, it can be seen that $S_i=b_i(\alpha^i)$; in other words, the six syndromes may be obtained by dividing the received code word by the minimal polynomials and then evaluating the remainder at $x=\alpha^i$. Another LFSR may be used to perform this division, as exemplified in figure 6.9 of the Lin and Costello reference. Again, 3- and 4-bit parallel capabilities are provided as the syndromes are computed over the entire code word including the check bits.

Once the six syndromes have been computed, they can be used to generate the error polynomial. The present invention provides a unique approach to solving the BCH-3 error polynomials which has many advantages over the prior art. In the prior art, an iterative algorithm (Berlekamp's) is used to compute the BCH-3 error polynomial, which requires up to five separate steps, with each step requiring a varying number of computations. The algorithm used herein is not iterative, but instead reduces the computations to six equations with only two branch decisions. In the prior art, implementing a BCH-3 algorithm in an iterative fashion requires approximately 30 clock cycles, and each clock cycle required by the prior art algorithm requires a corresponding memory element to store the incoming data. Consequently, in an OC-192 system, this requires 128 bits*30 cycles, or 3840 memory bits. In contrast, the present invention completes the BCH-3 error polynomial generation in only 12 cycles, and requires only 1536 memory bits. This implementation is further simpler in that the gate count is smaller, and it also uses less power than conventional techniques.

This novel approach uses three correction terms $d_0$, $d_1$ and $d_2$ which are computed by Galois field units as discussed further below. Based on a study of the branch outcomes, error polynomial generation is reduced to the following six equations:

$$d_0=S_1, \quad (1)$$

$$d_1=S_3+S_1S_2, \quad (2)$$

$$\sigma^1(x)=1+S_1X, \quad (3)$$

if ($d_1=0$) then $\sigma^2(x)=\sigma^1(x)$ else if ($d_0=0$) then $\sigma^2(x)=q_0\sigma^1(x)+d_1X^3$ else $\sigma^2(x)=q_0\sigma^1(x)+d_1X^2, \quad (4)$ $$d_2=S_5\sigma_0+S_4\sigma_1+S_3\sigma_2+S_2\sigma_3, \text{ and} \quad (5)$$

if ($d_2=0$) then $\sigma^3(x)=\sigma^2(x)$ else $\sigma^3(x)=q_1\sigma^1(x)+d_1X^3, \quad (6)$ where $d_i$ are the aforementioned correction factors, $S_i$ are the syndromes, $\sigma^i$ are the minimum-degree polynomials, $\sigma_i$ are the four coefficients for $\sigma^2(x)$, and $q_i$ are additional correction factors—$q_0$ is equal to $d_0$, unless $d_0$ is zero, in which case $q_0$ is 1, and $q_i$ is equal to $d_i$, unless $d_i$ is zero in which case $q_i=q_0$. The sixth syndrome is not used in the foregoing six equations, but is used when determining a "no error" condition (defined as all syndromes being equal to zero).

Figure 12:
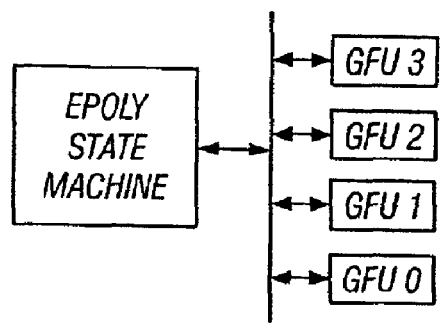
FIG. 12 illustrates a state machine and multiple Galois field multiply accumulators.

These six operations are performed via a hardwired microcoded machine architecture. As shown in FIG. 12, a state machine (Epoly) 154 controls four Galois field units 156a, 156b, 156c and 156d, each containing a Galois field (GF) multiply accumulator (MAC). Each GF unit 156a–156d represents the four powers of the error polynomial $\sigma=\sigma_0+\sigma_1X+\sigma_2X^2+\sigma_3X^3$. Epoly state machine 154 divides the computing problem into a control structure and a datapath structure. The data path structure contains the computational units (the GFUs), as well as one or more other blocks (not shown) that perform miscellaneous functions. The control structure is memory-based. The information stored in the memory can be considered a computer program and is referred to as microcode.

In this illustrative architecture, Epoly state machine 154 asserts control ports on the datapath structures in the proper sequence to execute the foregoing six equations. The sequence may be understood with reference to the following states that exist during the 13-cycle computation:

Cycle 1:
  Set $d_0$ equal to $S_1$ (equation 1).
  This is done through GFU_0. It is configured into pass through mode.
Cycle 2:
  Compute $d_1=S_{3+}S_1 S_2$ (equation 2).
  This is done using the multiplier in GFU_0 and passing $S_3$ through GFU_1.
Cycle 3:
  Compute $\sigma^1(X)=1+S_1 X$ (equation 3).
  GFU_1 passes through the $S_1$ and GFU_0 is programmed to pass the 1.
Cycle 4:
  Nothing is done. There are pipe stages between datapath elements that need to wait for $\sigma^1(X)$ computation to complete.
Cycle 5:
  Compute $\sigma^2(X)$ (equation 4). This is conditional on the values for $d_0$ and $d_1$.
  If d0=0 then $\sigma^2(X)=\sigma^1(X)$ so just path $\sigma^1(X)$.
  If d0=0 then compute $q_0$ $\sigma^1(X)+d_1 X^3$.
  Else compute $q_0$ $\sigma^1(X)+d_1 X^2$.
Cycle 6:
  Compute $d_2=S_5{}^*\sigma_0+S_4{}^*\sigma_1+S_3{}^*\sigma_2+S_2{}^*\sigma_3$
Cycle 7:
  Wait for $d_2$.
Cycle 8:
  Wait for $d_2$.
Cycle 9:
  Compute $\sigma^3(X)$ partial $\sigma^2(X)^*q_1$.
Cycle 10:
  Finish computation $\sigma^3(X)$.
Cycle 11, 12:
  Wait for final result.
Cycle 13:
  Error polynomial calculation completed. Load the result of the Chien block for evaluation of the roots.

Figure 13:
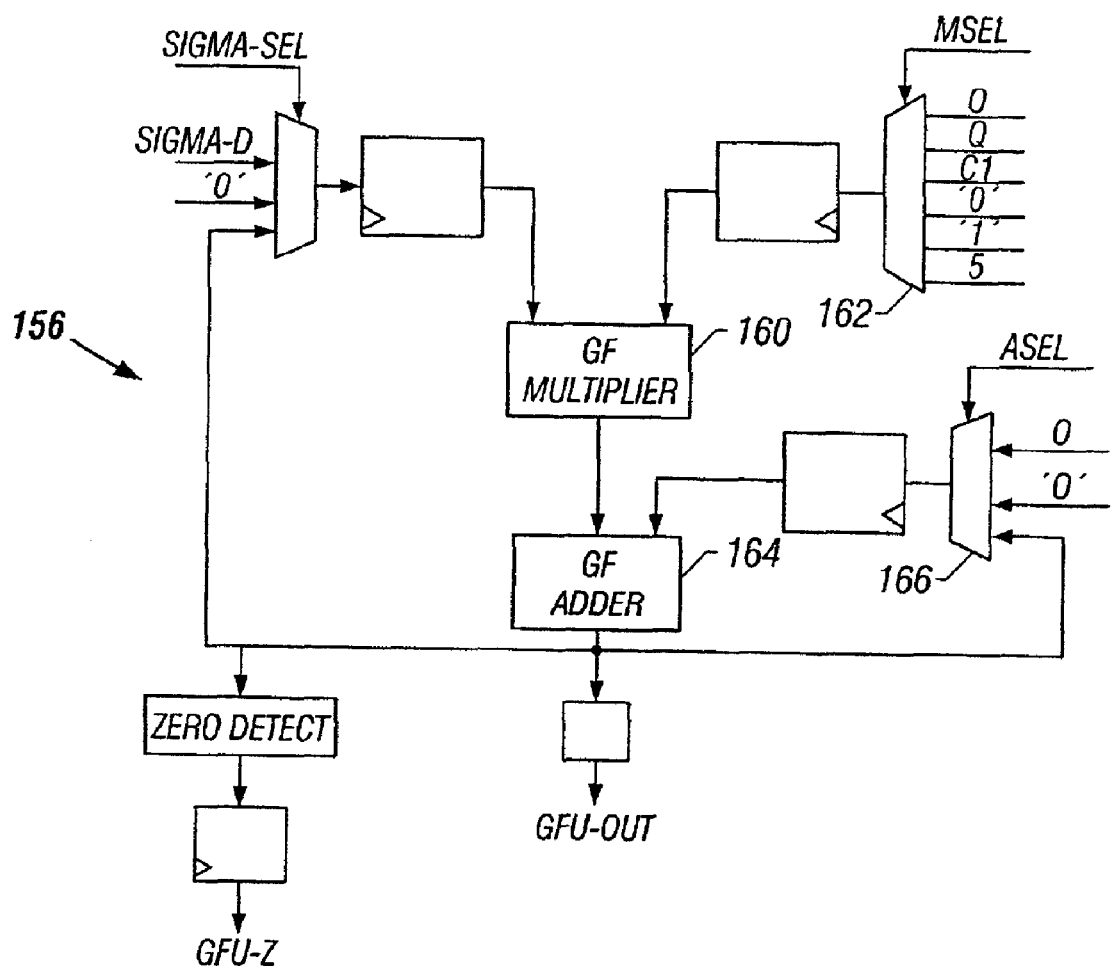
FIG. 13 illustrates a Galois field unit.

The default settings for GFU control produce a zero value at each of the GFU outputs. A "pass-through" mode can be used to initialize a downstream register such as the $d_0$ register. As further illustrated in FIG. 13, this mode may be enabled by placing the pass-through data onto one end of the input of the GF multiplier 160 and selecting a constant "1" value as the other operand using multiplexer 162. The output of the multiplier feeds the GF adder 164 so, in this mode, the other adder operand is set to zero using multiplexer 166. The inputs of each GFU 156a–156d are hard-wired to the five syndromes, the correction values $d_i$, and $q_i$ in such a way as to compute the six equations. In this manner, the four GFUs represent the four powers of the resultant error polynomial. This implementation can perform a GF multiply/accumulate operation in a single clock cycle by unraveling the serial algorithm into parallel operation.

Once the second overall step is complete (error polynomial generation), it is relatively straightforward to correct any errors. The roots of the error polynomial correspond to error location numbers. A conventional technique known as Chien's algorithm can be used to search for these error location numbers. The four coefficients are passed onto the Chien block, along with the power of the error polynomial (representing the number of errors in the code word), and the error count flag ("error_cnt_ok") which may be used to indicate the presence of more that three errors. The Chien search looks for errors by substituting GF elements into the error polynomial and checking for a zero. A zero indicates an error location and the corresponding payload data bit should be flipped. A suitable construction for a cyclic error location search unit is shown in figure 6.1 of the Lin and Costello reference. However, if the shortened code is being used, then the search cannot start at the first GF element $\sigma$. Also, the check bits might be before the message portion of the code word, so searching must start at the beginning of the check bits. Accordingly, the search is loaded at either the start of the payload (8190–4214) or at the start of the check bits (8190–39). In the illustrative embodiment, the search is operated in a parallel fashion and supports both 3- and 4-bit parallel operation.

Each decoding circuit 52 accumulates both corrected errors (up to 96 errors per row or 864 errors per SONET frame) and uncorrectable errors. The error polynomial generator can detect when the power of the error polynomial will grow beyond three. In this case, the Chien search is prevented from performing corrections and the uncorrectable accumulator is incremented by one. There are cases where more than three errors will produce a valid error polynomial. These cases can be handled by counting the number of errors corrected during the Chien search. If this number does not match the error polynomial calculation then the uncorrectable count is incremented and the correctable count is not changed. This approach maintains proper accumulator counts, but the Chien search has more than likely flipped the wrong bits and introduced further errors rather than correcting them.

It is desirable to provide a means of verifying the correct operation of the OC-192 FEC circuitry of the present invention. To this end, an error insertion circuit 152 (FIG. 10) is provided that can be programmed to insert from one to four errors into the FEC code word. Insertion occurs after the data has been scrambled and just before the final operation raising the signal from 77.76 MHz to 622 MHz. In the OC-192 application of the present invention, since there are 32 FEC code words defined within each of the nine SONET rows, the circuit cycles through all possible permutations of the 4215 FEC code word locations.

For example, if the number of errors is set to 1, then 4215 code words or SONET rows will be required to complete the test. Front-end ASIC 12 contains a total of 32 FEC units in operation during each row time. Error insertion can be prevented through an error mask for each of the 32 FEC units. If all units are unmasked then a complete single bit error permutation cycle would insert 134880 (4215*32) errors. If the FEC decoder were used to remove the errors, its 16-bit correction accumulator would be set to 3808 (134880mod65536). The error accumulators are monitored via the CPU interface.

Circuit 152 can also be programmed to stop after one permutation cycle or programmed to run continuously. The single cycle case (run once mode) is particularly useful to verify proper functioning of the FEC error accumulators. A short frame mode may also be used to allow for a shorter permutation cycle. For example, in short frame mode, the error insertion might be limited to 19 code word locations.

Table 4 below shows the number of permutations and the run time for the possible error settings. The error accumulation data assumes error insertion on all 32 FEC units.

TABLE 4

Error Counts and SONET Frames for Different Error Settings.

| Errors | Short frame | Permutation count | SONET Frames | Time | Error Accumulator |
|---|---|---|---|---|---|
| 1 | no | 4215 | 469 | <1 sec | 4215 |
| 2 | no | 8,881,005 | 986779 | 2.06 min | 56128 |
| 3 | no | 12,471,891,355 | $1.37 \times 10^9$ | 47.58 hours | 57344 |
| 4 | no | huge | huge/9 | >5 years | unknown |
| 1 | yes | 19 | 3 | <1 sec | 19 |
| 2 | yes | 171 | 19 | <1 sec | 10944 |
| 3 | yes | 969 | 108 | <1 sec | 27488 |
| 4 | yes | 3060 | 340 | <1 sec | unknown |

The basic element of error injection circuit 152 is a location counter which increments through each location of the FEC code word. The location counter may be represented by three registers which correspond respectively to the SONET column, an index location, and a byte location. The index and byte locations together represent the SONET byte location. The column counter ranges from 3 through 90 (there being 90 check bits which trigger during columns 1 and 2), the index counter ranges from 0 to 11, and the byte counter ranges from 0 to 3. Separate index and byte counters are provided for timing reasons, considering the clock speed and the size of the internal datapath of ASIC 12.

Each location counter has two control inputs, one for initializing, and one for loading. The counter is set to column=3, index=0 upon the assertion of the initializing control input. The byte location is set to 0, 1, 2 or 3 as discussed further below. For single-bit errors, only one location counter is used. The output of the location counter represents the exact location to insert an error in the SONET data stream. Thus, the data stream column/index/byte position is monitored and when the location counter registers match, an error is inserted by flipping the corresponding bit. For 2-bit errors, three location counters (LCs) are needed. Two LCs control one error location, and the other LC is used to control the other error location. The paired LCs are nested to allow for the permutation through all possible combinations of the two bit errors. For 3- and 4-bit error insertion, the construction of the LCs is extrapolated from the 2-bit example. In the 3-bit construction, six total LCs are needed, with one pair nested as before, and another three LCs nested together. In the 4-bit construction, 10 total LCs are needed, with one pair nested as before, another three LCs nested together as before, and four more LCs nested together.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. For example, while the present invention has been described in the context of a SONET fiber-optic network, SONET can be implemented on any transmission medium (e.g., copper) that meets the bandwidth requirements. It is therefore contemplated that such modifications can be made without departing from the spirit or scope of the present invention as defined in the appended claims.

APPENDIX

SIGNAL AND POWER PIN DESCRIPTION

| Pin Name (I/O Type) | Pin Description |
|---|---|
| RXL_CLK622P/N | Receive Line Clock 722 MJz (Positive and Negative). 622 MHZ input clock driven from the line side OC-192 demux chip. This clock is used to derive all timing for the receive signal path. This clock is divided by four internally to create the RXD (3:0)_CLK155P/N AND RXD_REFCK155P/N 144 MHz output clocks. This clock is the reference for the RXL_DATP/N [15:0] input data bus. |
| RXL_DATP/N [15:0] (Input) | Receive Line Data (Positive and Negative). Parallel 16-bit line side data input from external OC-192 demux chip. Data is 622 MHz synchronous with respect to RXL-CLK622P/N. Input data is NOT BYTE ALIGNED. This inputs are latched on the rising edge of RXL-CLK622P. RXL_DATP/N[15] is the MSB (first bit received). |
| TXL_CLK622P/N (Output) | Transmit Line Input Clock 622 MHz (Positive and Negative). 622 MHz input clock driven from the line side OC-192 mux chip (or from a system clock generation circuit). This clock is used to drive all timing for the transmit path. This clock is divided by four internally to generate the TXD{3:0}_CLK155P/N 155 MHz output clocks. This clock is the reference for the TXL_DATP/N [15:0] output data bus. This signal or the 155 MHz version below will be used as the input to the PLL. |
| TXL_DCLK622P/N (Output) | Transmit Line Data Clock 622 MHz (Positive and Negative). 622 MHz output clock that is centered in the TXL_DATP/N [15:0] data bus eye. This clock is fed into a PLL externally and is used as an input to the OC-192 mux device as a reference for the TXL-DATP/N[15:0] output data bus. This signal may be used in lieu of the TXL_DCLK622P/N clock as the input to the external de-jitter PLL. |
| TXL_DATP/N[15:0] (Output) | Transmit Line Output DATa (Positive and Negative). Parallel 16-bit line side data output to external OC-192 mux chip. Data is 622 MHZ synchronous with respect to TXL_DCLK622P. TXL_DATP/N[15] is the most significant bit corresponding to the first bit transmitted. |
| RXD{3:0}_CLK155P/N | Receive Demux {Ports 3:0} Output ClocK 155 MHz (Positive and Negative). 155 MHz output clocks normally derived from the RXL_CLK622P/N input. This clock is replicated for each of the four demux side output ports of the front-end ASIC chip (i.e., a single point to point clock pin pair is provided for each of the downstream OC-48 processors). This clock is the reference for the RXD {3:0}_DAT[15:0] output data bus which is registered on the rising edge of RXD {3:}_CLK155P. |
| RXD_REFCK155P/N (Output) | Receive Demux Output REFerence Clock 155 MHz output clock normally derived from the RXL_CLK622P/N input. This clock is a copy of the RXD {3:0}_CLK155P/N outputs and is provided as a line rate 155 MHz reference clock source. |
| RXD {3:0}_DAT[15:0] (Output) | Receive Demux {Ports 3:0} Output DATa. Parallel 16-bit demux side data output to external OC-48 processor chips. Data is 155 MHz synchronous with respect to RXD {3:0}_CLK155P/N. The RXD {3:0)_DAT[15:0] output register changes on the rising edge RXD{3:0}_CLK155P. |

APPENDIX-continued

SIGNAL AND POWER PIN DESCRIPTION

| Pin Name (I/O Type) | Pin Description |
|---|---|
| | RXD {3.0}_DAT[15] is the most significant big corresponding to the first bit transmitted. These output buggers may be optionally operated at CMOS levels when the RXD-DMOS control bit in the G-CRO register is set. |
| RXD(3:0)_BPCLKP/N (Output) | Receive Demux {Ports 3:0} BackPlane ClocK (Positive and Negative). 155 MHz output clocks derived from the BP-CLK155P/N input or from a divide by four version of the TXL_CLK622P/N clock input. This clock is replicated four times on the front-end ASIC chip (i.e., a single point to point clock pin pair is provided for each of the downstream OC-48 processors). These pins should be connected to the RO_CLK 155P/N backplane side clock inputs of the downstream OC-48 processors. This clock is the reference for the RXD{3.0}_BPSYNC output sync pins. |
| RXD{3.0}_BPSYNC (output) | Receive Demux {Ports 3:0} BackPlane SYNC. Sync pins provided to the backplane side port of the OC-48 processors to synchronize all OC-48 processors backplane framing together. (These signals are provided to keep the OC-192 signal sync'd closely enough together such that the signal can be reassembled after having passed through the matrix.) The location of these sync pins in time is controlled by the BP_FRSYNC input pin. These pins should be connected to the RO_FR_SYNC inputs of the downstream OC-48 processors. |
| BP-CLK155P/N (Input) | BackPlane Input ClocK 155 MHz (Positive and Negative). 155 MHz input clock used to (optionally) generate the four RXD{3:0}_BPCLKP/N output clocks. This input is used as the reference for the RXD {3:0}_BPCLKP/N outputs when the SEL_BP_CLK control bit in the G_CR-register is set to a '1'. |
| BP-FRSYNC (Input) | BackPlane Frame SYNC. Signal used to synchronize the backplane ports of the four OC-48 processors. This input is used to generate the four RXD{3:0}_BPSYNC output signals. |
| FB_FAILB[1.0] <or> *Test (Output) | FoRce FRAME. Signal used to indicate a front-end ASIC condition that requires the downstream OC-48 processors to reacquire frame. The 1 and 0 pins of this signal are redundant copies such that each pin only drives two of the four downstream OC-48 processors. These pins should be connected to the FRC_FRAME inputs of the OC-48 processors. These pins, when active, are a frame synchronous positive pulse with a pulse width of four 155 MHz clocks. These output pins are considered to be received asynchronously at the downstream OC-48 processors to which they connect. |
| FRC_FRAME [1.0] (Output) | FoRce FRAME. Signal used to indicate a front-end ASIC condition that requires the downstream OC-48 processors to reacquire frame. The 1 and 0 pins of this signal are redundant copies such that each pin only drives two of the four downstream OC-48 processors. These pins should be connected to the FRC-FRAME inputs of the OC-48 processors. These pins, when active, are a frame synchronous positive pulse with a pulse width of four 155 MHz clocks. These output pins are considered to be received asynchronously at the downstream OC-48 processors to which they connect. |

APPENDIX-continued

SIGNAL AND POWER PIN DESCRIPTION

| Pin Name (I/O Type) | Pin Description |
|---|---|
| TXD{3.0}_CLK155P/N (Output) | Transmit Demux (Ports 3:0) Output ClocK 155 MHz (Positive and Negative). 155 MHz output clocks (normally) derived from a divide-by-four of the TXL_CLK622P/N input. This clock is replicated for each of the four demux side input ports of the front-end ASIC chip (i.e., a single point to point clock pin pair is provided for each of the upstream OC-48 processors). These clocks provide the 155 MHz clock inputs to the OC-48 processors TO ports and should be connected to the TO_CLK155P/N inputs on the OC-48 processors. |
| TXD{3:0}_DAT[15:0] (Input) | Transmit Demux {Ports 3:0} Input DATa (Positive). Parallel 16-bit demux side data input from external OC-48 processors. Data is 155 MHz synchronous with respect to TXD{3:0}_DCKLINP/N. The TXD{3:0}_DAT[15:0] input data is latched into a phase aligning FIFO using the TXD{3:0}_DCLKINP clock signals. TXD{3.0}_DAT[15] is the most significant bit corresponding to the first it received. These inputs are always 16-bit aligned data (except in the loopback mode). |
| TXD{3:0}_DCLKINP/N (Input) | Transmit Demux {Ports 3:0} Data ClocK Input (Positive and Negative). 155 MHz input clocks delivered from the four TO_CLKOUTP/N pin pairs on the upstream OC-48 processors. This clock is replicated for each of the four TXD input ports of the front-end ASIC chip (i.e., a single point to point clock pin pair is provided for each of the upstream OC-48 processors). These clocks are the reference for the TXD{3:0}_DAT[15:0] input data buses, which are latched on the rising edge of TXD {3:0}_DCLKINP. These pins are used to support the contra-clocking interface of the front-end ASIC device. |
| TXD{3:0}_FRLOC (Input) | Transmit Demux {Ports 3:0} Frame LOCation. Signal used by the front-end ASIC to determine frame location of the received data on the TXD ports. (Inclusion of this signal eliminates the need for a framer on the TXD input data ports.) These signals are driver synchronously with the TXD {3:0}_DCLKINP/N signals. These signals are asserted for a single 155 MHz clock period when active. |
| TXD{3:0}_FRSYNC (Output) | Transmit Demux {Ports 3:0} Frame SYNC. Signal used to reset the downstream OC-48 processors input framers and to force them to reacquire framing. This signal is used to force all downstream OC-48; processors to be sending transmit data in frame alignment. These signals are driven synchronously with the TXD{3.0}_CLK155P/N signals. These signals are asserted for a single 155 MHz clock period when active. These outputs may be optionally operated at CMOS levels when the FRSYNC_CMOS bit is s3et in the G_CR0 register. |
| TXD{3:0}_VREF (Input) | Transmit Demux {Ports 3:0} Voltage REFerence. These inputs are used to supply the input center voltage around which the single ended LVPECL input buffers should switch. These pins provide the center reference voltage for the TXD{3:0}_FRSYNCH output signals. |
| T_192C_DETB (Input) | Transmit 192C DETect (Bar). This input signal is driven in a wire or manner from the four external OC-48 processors. The front-end ASIC monitors this signal and uses it to determine if an AIS insertion should be made |

APPENDIX-continued

SIGNAL AND POWER PIN DESCRIPTION

| Pin Name (I/O Type) | Pin Description |
| --- | --- |
| | on the TXL line side output signal. (Note: current implementation does not use this input signal.) |
| RXL_LOSB (Input) | Receive Line Loss Of Signal (Bar). Input that is received directly from the line side optics module to indicate loss of light. |
| R_FP <or> *Test (Output) | Receive Port Frame Pulse or Test function. Signal that indicates the position of the framing on the RXL receive line input port. This signal is driven high on the clock cycle following the second A2 byte having been received. The signal remains asserted for twenty-four 622 MSz-clock periods. When used externally, a rising edge detection should be used to detect the assertion of this signal. This signal marks the start of unframed data in the R_TDM and R_WCC serial channels. |
| R_TDM_DAT <or> *Test (Output) | Receive TDM Serial DATa or Test function. Serial data output that has been extracted from the receive line side overhead bytes (J0, E1, F1, E2, D1–D12). This output changes on the falling edge of R_TDM_CLK and is latched by external devices on the rising edge of R_TDM_CLK. |
| R_TDM_CLK <or> *Test (Output) | Receive TDM ClocK or Test function. Output clock used to clock serial data on the R_TDM_DAT pin. R_TDM_DAT pin changes on the falling edge of this clock. |
| R_WCC_DAT <or> Test (Output) | Receive WARP Communication Channel DATa or Test function. Serial data output that has been extracted from the receive line side D4, D5, and D7 overhead bytes as specified in the WCCR register). This output changes on the falling edge of R_WCC_CLK and is latched by external devices on the rising edge of R_WCC_CLK. |
| R_WCC_CLK <or> Test (Output) | Receive WARP Communication Channel ClocK or Test function. Output clock used to clock serial data on the R_WCC_DAT pin. The R_WCC_DAT data output changes on the falling edge of this clock. |
| T_FP <or> Test (Output) | Transmit Port Frame Pulse or Test function. Signal that indicates the position of the framing on the TXL line output port. This signal is driven high on the clock cycle when the 3$^{rd}$ and 4$^{th}$ A2 bytes are on the TXL output data port and remains asserted for twenty-four 622 MHz-clock periods. This signal is used to mark the start of unframed data in the T_TDM and T_WCC serial channels. |
| T_TDM_DAT <or> *Test (Input) | Transmit TDM Serial DATa or Test function. Serial data input used for data to be inserted into the transmit line side overhead bytes (J0, E1, F1, E2, and D1–D12). This input is latched on the rising edge of T-TDM_CLK and is updated by external interface devices on the falling edge of T_TDM_CLK. A pull-up resistor is included on this pin to hold pin state when the input is unused. |
| T_TDM_CLK (Output) | Transmit TDM ClocK. Output clock used to clock serial data on the T_TDM_DAT pin. The T_TDM_DAT data input is latched on the rising edge of this clock. |
| T_WCC_DAT (Input) | Transmit WARP Communication Channel DATa. Serial data input used for data to be inserted into the transmit line side D4, D5, and D7 line overhead bytes. This input is latched on the rising edge of T_WCC_CLK and is updated by external interface devices on the falling edge of T_WCC_CLK. A pull up resistor is included on this pin to hold pin state when the input is unused. |
| T_WCC_CLK (Output) | Transmit WARP Communication Channel ClocK. Output clock used to clock serial data on the T_WCC_DAT pin. The T_WCC_DAT data input is latched on the rising edge of this clock. |
| CSB (Input) | Chip Select (Bar). Chip select input or the CPU interface. This input must be active to address the front-end ASIC internal registers. |
| ADDR[10:1] <or> *Test (Input) | CPU interface ADDRess [10:1] input or Test function. Driven by external on-board CPU. Fused to address internal device registers. |
| DATA[15:0] (bi-directional) | CPU interface DATA bus. Bi-directional data bus used to transfer data to and from the internal on-board CPU. Used to address internal device registers. |
| RSTB (Input) | ReSeT (Bar) signal. Asynchronous input used to reset the device. Signal is active low input. |
| RWB (Input) | Read/Write (Bar) Read/Write indication. A high on this signal indicates a read cycle and a low indicates a write cycle. |
| OENB (Input) | Output Enable (Bar). The output enable for the CPU Data bus. This input must be driven during CPU read cycles to enable the DATA [15:0] data bus. |
| CPU_TS_B (Input) | CPU Transaction Start (Bar). Indicates the start of a CPU bus cycle. |
| INTRB (Output) | INTeRrupt (Bar). An interrupt signal used to indicate a pending interrupt from the front-end ASIC device. This is an open collector output and requires a pullup resistor on the PCB. |
| CPU_CLK (Input) | CPU ClocK input. This input is supplied by the external CPU and is used to synchronize register read/write operations to the CPU bus rate. |
| CLK_32KHZ (Input) | ClocK 32 KHZ input. A 32 KHZ input clock used for timing of out-of-frame, loss-of-frame and loss-of-signal. |
| BIAS {3.0}_Y1 (RB), BIAS {3.0}_YV (VB), (Input) BIAS {3.0}_Z1 (RB), BIAS {3.0}_ZV (VB), (Input) BIAS_K1 (RB), BIAS_KV (VB), (Input) BIAS_J1 (RB), BIAS_JV (VB), (Input) | BIAS {3.0} Circuit Y Icc Reference, BIAS {3.0} Circuit Y Voltage Reference, BIAS {3.0} Circuit Z Icc Reference, BIAS {3.0} Circuit Z Voltage Reference, BIAS Circuit K Icc Reference, BIAS Circuit K Voltage Reference, BIAS Circuit J Icc Reference, BIAS Circuit J Voltage Reference, These pins are used to control the generation of the source and sink currents for the LVPECL output buffers. Each bias circuit powers 9 LVPECL outputs. There are ten individual BIAS circuits described in this group. Each of the four demux side ports (as indicated by the 3:0 designation) contains a Y and a Z BIAS circuit. Each bias circuit has a voltage and a current reference input. This BIAS circuits control output pins (on the respective demux side ports) as follows: BIAS{ }_Y: TXD{ }_CLK155P/N, RXD{ }_CLK155P/N, and RXD{ }_DATA[15:9] BIAS{ }_Z: RXD{ }_DATA[8:0] BIAS_K: RXD[1.0]_BPCLKP/N, TXD {3:2}_FRSYNC. BIAS_J: RXD[3.2]_BPCLKP/N, TXD {1:0}_FRSYNC, RXD_REFCK155P/N. See Section 13.5, "LVPECL Bias Circuits and Terminations" for recommended external BIAS circuit connections. |
| TST_CFG[2:0] (Input) | TeST ConFiGuration inputs [2:0]. These inputs are used to enable the different possible test modes of the device. These |

APPENDIX-continued

SIGNAL AND POWER PIN DESCRIPTION

| Pin Name (I/O Type) | Pin Description |
|---|---|
| | inputs include pull down resistors such that normal device operating mode is selected when these inputs are left unconnected. See Section 11, "TEST Modes and Features" for information on the function and usage of this pins. |
| NAND_CHN (Output) | NAND ChaiN. This pin is the output of the internal NAND Chain used for output pin DC level testing. This output pins is normally tristated and only becomes active when the Input Levels Test Mode is selected via the TST_CFG[2:0] test configuration pins. See Section 11, "TEST Modes and Features" for information on the function and usage of this pins. |
| VREFH (PWR) | High reference voltage and bias current supply for all LVDS type output drivers. |
| VREFL (PWR) | Low reference voltage and bias current supply for all LVDS type output drivers. |
| VDD3 (PWR) | 3.3 V IO VDD Supply. Used for all TTL type and all LVPECL type IO buffers. |
| VDD2 (PWR) | 2.5 V Core VDD Supply. Used for internal device core logic and for the digital logic portions of the LVDS IO buffers. |
| VSS (PWR) | Ground connection for IO buffers and core logic. |

What is claimed is:

1. A method of verifying correct operation of a forward error correction decoder, comprising the steps of:
   programmably selecting a desired number of errors for insertion into a plurality of data signals;
   defining a plurality of code words of the data signals;
   inserting into one of the data signals the desired number of errors using an error insertion circuit;
   repeating said inserting step in an iterative fashion to insert into different data signals the desired number of errors wherein the errors are placed within the code words of the data signals at different location permutations for each data signal;
   transmitting the data signals with the inserted errors to a receiver; and
   determining that the data signals received at the receiver contain the inserted errors.

2. The method of claim 1 wherein said repeating step cycles through all possible permutations of all the code word locations.

3. The method of claim 1 wherein the error insertion circuit operates in one of a plurality of modes, including a short frame mode for shorter permutation cycles, and further comprising the steps of:
   selecting the short frame mode for operation; and
   in response to said selecting step, limiting said repeating step to cycle through less than all possible permutations of all the code word locations.

4. The method of claim 1 wherein:
   the data signal is a SONET data signal having nine rows; and
   said repeating step results in the insertion of errors in 32 code words defined within each of the nine SONET rows.

5. The method of claim 1 wherein said repeating step stops after one permutation cycle in response to the further step of programming the error insertion circuit for single cycle operation.

6. The method of claim 1 wherein said determining step includes the step of examining an error accumulator count in the receiver to match a number of accumulated errors with the number of inserted errors.

7. The method of claim 6 wherein said examining step matches the number of accumulated errors with the number of inserted errors using a modulo function.

8. The method of claim 1 wherein:
   the error insertion circuit includes an error mask for selectively preventing insertion of one or more of the errors; and
   said repeating step is limited to inserting errors in selected code words based on the error mask.

9. The method of claim 1 wherein said repeating step includes the step of tracking the location of a current code word in which an error is being inserted.

10. The method of claim 9 wherein said tracking step includes the step of incrementing one or more registers in a location counter having at least first, second, and third registers, the first register corresponding to a column location, the second register corresponding to an index location, and the third register corresponding to a byte location.

11. A method of injecting a plurality of errors into a SONET data stream, comprising the steps of:
   programming an error insertion circuit to select a desired number of errors for insertion into a plurality of successive SONET data signals each having a plurality of rows;
   defining a plurality of forward error correction (FEC) code words within each of the rows of the SONET data signals;
   inserting the desired number of errors into a first one of the SONET data signals at a first code word permutation location, using the error insertion circuit;
   tracking the first code word permutation location in response to said step of inserting the desired number of errors into the first SONET data signal; and
   inserting the desired number of errors into a second one of the SONET data signals at a second code word permutation location, using the error insertion circuit, and in response to said tracking step.

12. The method of claim 11 further comprising the step of programming the error insertion circuit for single cycle operation.

13. The method of claim 11 further comprising the step of programming the error insertion circuit for short frame mode operation.

14. The method of claim 11 wherein said tracking step includes the step of incrementing one or more registers in a location counter having at least first, second, and third registers, the first register corresponding to a SONET column location, the second register corresponding to an index location, and the third register corresponding to a byte location, the index and byte locations together representing a SONET byte location.

15. The method of claim 11 wherein said inserting steps occur after the further step of scrambling the SONET data signals.

16. An error injection circuit comprising:
   means for selectively programming a desired number of errors for insertion into a plurality of data signals;
   means for defining a plurality of code words of the data signals; and
   means for repeatedly inserting the desired number of errors into different ones of the data signals at different code word permutation locations.

17. The error injection circuit of claim 16 wherein said inserting means cycles through all possible permutations of all the code word locations.

18. The error injection circuit of claim 16 further comprising means for selecting a short frame mode of operation, wherein said inserting means limits insertion of the errors to cycle through less than all possible permutations of all the code word locations when the short frame mode of operation is selected.

19. The error injection circuit of claim 16 wherein:
the data signal is a SONET data signal having nine rows; and
said inserting means inserts errors in 32 code words defined within each of the nine SONET rows.

20. The error injection circuit of claim 16 further comprising means for selecting single cycle operation, wherein said inserting means stops inserting errors after one permutation cycle when the single cycle operation is selected.

21. The error injection circuit of claim 16 further comprising error mask means for selectively preventing insertion of one or more of the errors, wherein said inserting means inserts errors in selected code words based on said error mask means.

22. The error injection circuit of claim 16 wherein said insertion means includes means for tracking the location of a current code word in which an error is being inserted.

23. The error injection circuit of claim 16 wherein said tracking means increments one or more registers in a location counter having at least first, second, and third registers, the first register corresponding to a column location, the second register corresponding to an index location, and the third register corresponding to a byte location.

24. An OC-192 input/output card comprising:
four OC-48 processors; and
an OC-192 front-end application-specific integrated circuit (ASIC) connected to said four OC-48 processors, said OC-192 front-end ASIC including
a transmitter having means for interleaving four OC-48 signals to create an OC-192 signal, and means for encoding forward error correction (FEC) codes in each of the four OC-48 signals,
a receiver having means for de-interleaving an OC-192 signal to create four OC-48 signals, and means for decoding FEC codes in the OC-192 signal, and
means for verifying correct operation of said encoding means and said decoding means, wherein said verifying means includes:
means for selectively programming a desired number of errors for insertion into a plurality of successive SONET data signals;
means for defining a plurality of FEC code words of the SONET data signals;
means for repeatedly inserting the desired number of errors into different ones of the SONET data signals at different code word permutation locations;
means for routing the SONET data signals with the inserted errors from said transmitter to said receiver; and
means for determining that the SONET data signals received at said receiver contain the inserted errors.

25. The OC-192 input/output card of claim 24 wherein said inserting means cycles through all possible permutations of all the FEC code word locations.

26. The OC-192 input/output card of claim 24 further comprising means for selecting a short frame mode of operation, wherein said inserting means limits insertion of the errors to cycle through less than all possible permutations of all the code word locations when the short frame mode of operation is selected.

27. The OC-192 input/output card of claim 24 further comprising means for selecting single cycle operation, wherein said inserting means stops inserting errors after one permutation cycle when the single cycle operation is selected.

28. The OC-192 input/output card of claim 24 further comprising error mask means for selectively preventing insertion of one or more of the errors, wherein said inserting means inserts errors in selected code words based on said error mask means.

29. The OC-192 input/output card of claim 24 wherein said insertion means includes means for tracking the location of a current code word in which an error is being inserted.

30. The OC-192 input/output card of claim 29 wherein said tracking means increments one or more registers in a location counter having at least first, second, and third registers, the first register corresponding to a SONET column location, the second register corresponding to an index location, and the third register corresponding to a byte location, the index and byte locations together representing a SONET byte location.

31. The OC-192 input/output card of claim 30 wherein said tracking means contains 10 location counters, including:
a first location counter for tracking a location of a first error bit;
second and third location counters nested together for tracking a location of a second error bit;
fourth, fifth and sixth location counters nested together for tracking a location of a third error bit; and
seventh, eighth and ninth location counters nested together for tracking a location of a fourth error bit.

32. The OC-192 input/output card of claim 24, wherein said programming means allows from one to four errors to be inserted in a given SONET data signal.

33. The OC-192 input/output card of claim 24 wherein said determining means includes an error accumulator located in said receiver, and means for examining an error accumulator count of the error accumulator to match a number of accumulated errors with the number of inserted errors.

34. The OC-192 input/output card of claim 33 wherein said error accumulator accumulates both corrected errors and uncorrectable errors.

35. An OC-192 input/output card comprising:
four OC-48 processors; and
an OC-192 front-end application-specific integrated circuit (ASIC) connected to said four OC-48 processors, said OC-192 front-end ASIC including
a transmitter having means for interleaving four OC-48 signals to create an OC-192 signal, and means for encoding forward error correction (FEC) codes in each of the four OC-48 signals,
a receiver having means for de-interleaving an OC-192 signal to create four OC-48 signals, and means for decoding FEC codes in the OC-192 signal, and
means for verifying correct operation of said encoding means and said decoding means, wherein said encoding means and said decoding means use a triple-error correcting Bose-Chaudhuri-Hocquenghem (BCH) code.

36. An error injection circuit comprising:

an error selection interface which programs a desired number of errors for insertion into a plurality of data signals;

an encoding circuit which defines a plurality of code words of the data signals; and a location counter which increments through a plurality of locations in each of the code words and inserts the desired number of errors into different ones of the data signals at different code word permutation locations.

37. The error injection circuit of claim 36 wherein said location counter means cycles through all possible permutations of all the code word locations.

38. The error injection circuit of claim 36 wherein:

the data signal is a SONET data signal having nine rows; and said inserting means inserts errors in 32 code words defined within each of the nine SONET rows.

39. The error injection circuit of claim 36 further comprising an error mask which selectively prevents insertion of one or more of the errors in selected code words.

* * * * *